United States Patent
Horn et al.

(10) Patent No.: US 10,437,155 B2
(45) Date of Patent: *Oct. 8, 2019

(54) SENSOR ASSEMBLY AND METHOD FOR DETERMINING RESPECTIVE POSITIONS OF A NUMBER OF MIRRORS OF A LITHOGRAPHY SYSTEM

(71) Applicant: Carl Zeiss SMT GmbH, Oberkochen (DE)

(72) Inventors: Jan Horn, Munich (DE); Stefan Krone, Aalen (DE); Lars Berger, Aalen-Unterkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 30 days.

This patent is subject to a terminal disclaimer.

(21) Appl. No.: 15/807,813

(22) Filed: Nov. 9, 2017

(65) Prior Publication Data
US 2018/0067400 A1    Mar. 8, 2018

Related U.S. Application Data

(63) Continuation of application No. PCT/EP2016/060978, filed on May 17, 2016.

(30) Foreign Application Priority Data

May 18, 2015   (DE) .................. 10 2015 209 077

(51) Int. Cl.
*G03F 7/20*       (2006.01)
*G01D 5/347*   (2006.01)
(Continued)

(52) U.S. Cl.
CPC ........ *G03F 7/70258* (2013.01); *G01B 11/002* (2013.01); *G01B 11/026* (2013.01);
(Continued)

(58) Field of Classification Search
CPC ............. G03F 7/70258; G03F 7/70825; G03F 7/7085; G01B 11/002; G01B 11/026; G01B 11/26; G01D 5/347
See application file for complete search history.

(56) References Cited

U.S. PATENT DOCUMENTS

2004/0227915 A1   11/2004   Ohtsuka
2004/0263812 A1   12/2004   Hummel et al.
(Continued)

FOREIGN PATENT DOCUMENTS

DE   10 2010 053 993 A1   6/2012
DE   10 2011 005 882 A1   9/2012
(Continued)

OTHER PUBLICATIONS

Machine translation of DE 10 2012 216286 Vogt, Apr. 2013.*
(Continued)

*Primary Examiner* — Peter B Kim
(74) *Attorney, Agent, or Firm* — Fish & Richardson P.C.

(57) ABSTRACT

Sensor arrangements, methods for ascertaining a respective position of a number of mirrors of a lithography apparatus, projection systems of a lithography apparatus, and lithography apparatus are disclosed. The sensor arrangement includes at least one position sensor apparatus for providing a position signal for a mirror and an evaluation apparatus for ascertaining the position of the mirror depending on the position signal.

34 Claims, 17 Drawing Sheets

(51) Int. Cl.
*G01B 11/00* (2006.01)
*G01B 11/26* (2006.01)
*G01B 11/02* (2006.01)

(52) U.S. Cl.
CPC ............. *G01B 11/26* (2013.01); *G01D 5/347* (2013.01); *G03F 7/7085* (2013.01); *G03F 7/70825* (2013.01)

(56) References Cited

U.S. PATENT DOCUMENTS

| | | |
|---|---|---|
| 2010/0039629 A1 | 2/2010 | Xalter et al. |
| 2011/0199597 A1 | 8/2011 | Hummel et al. |
| 2013/0343422 A1 | 12/2013 | Laufer |
| 2016/0091798 A1 | 3/2016 | Paul et al. |
| 2018/0067400 A1 | 3/2018 | Horn |

FOREIGN PATENT DOCUMENTS

| | | |
|---|---|---|
| DE | 10 2011 005 885 A1 | 9/2012 |
| DE | 10 2012 216 286 A1 | 4/2013 |
| DE | 10 2013 214 008 A1 | 1/2015 |
| EP | 1 345 082 A1 | 9/2003 |
| EP | 2 511 765 A2 | 10/2012 |
| WO | WO 03/052511 A2 | 6/2003 |

OTHER PUBLICATIONS

Translation of International Search Report for corresponding Appl No. PCT/EP2016/060978, dated Aug. 19, 2016.

Massari et al., "A Fast CMOS Optical Position Sensor with High Subpixel Resolution," IEEE Transactions on Instrumentation and Measurement, IEEE Service Center, vol. 53, No. 1, Feb. 2004, pp. 116-123.

Makinouchi et al., "An evaluation of a modulated laser encoder," Precision Engineering 35 (2011) 302-308.

Translation of International Search Report for corresponding Appl No. PCT/EP2016/059766, dated Aug. 19, 2016.

\* cited by examiner

SENSOR ASSEMBLY AND METHOD FOR DETERMINING RESPECTIVE POSITIONS OF A NUMBER OF MIRRORS OF A LITHOGRAPHY SYSTEM

CROSS-REFERENCE TO RELATED APPLICATIONS

The present application is a continuation of, and claims benefit under 35 USC 120 to, international application PCT/EP2016/060978, filed May 17, 2016, which claims benefit under 35 USC 119 of German Application No. 10 2015 209 077.9, filed May 18, 2015. The entire disclosure of these applications are incorporated by reference herein.

FIELD

The disclosure relates to sensor arrangement and a method for ascertaining a respective position of a number of mirrors of a lithography apparatus, a projection system of a lithography apparatus, and a lithography apparatus.

BACKGROUND

Microlithography is used for producing microstructured components, such as for example integrated circuits. The microlithographic process is carried out with a lithography apparatus, which has an illumination system and a projection system. The image of a mask (reticle) illuminated via the illumination system is in this case projected via the projection system onto a substrate (for example a silicon wafer) coated with a light-sensitive layer (photoresist) and arranged in the image plane of the projection system, in order to transfer the mask structure to the light-sensitive coating of the substrate.

Driven by the desire for ever smaller structures in the production of integrated circuits, currently under development are EUV lithography apparatuses that use light with a wavelength in the range of 0.1 nm to 30 nm, in particular 13.5 nm. In the case of such EUV lithography apparatuses, because of the high absorption of light of this wavelength by most materials, reflective optical units, that is to say mirrors, have to be used instead of—as previously—refractive optical units, that is to say lens elements. For the same reason, beam forming and beam projection should be carried out in a vacuum.

The mirrors may for example be fastened to a supporting frame (force frame) and be configured as at least partially manipulable or tiltable in order to allow a movement of a respective mirror in up to six degrees of freedom, and consequently a highly accurate positioning of the mirrors in relation to one another, in particular in the pm range. This allows changes in the optical properties that occur for instance during the operation of the lithography apparatus, for example as a result of thermal influences, to be corrected.

For the purposes of displacing the mirrors, in particular in the six degrees of freedom, actuators which are actuated by way of a control loop are assigned to the former. An apparatus for monitoring the tilt angle of a respective mirror is provided as part of the control loop.

Document WO 03/052511 A2 discloses an imaging device in a microlithographic projection exposure apparatus. The imaging device has at least one optical element and at least one manipulator, having a linear drive, for manipulating the position of the optical element. Here, the linear drive has a driven portion and a non-driven portion which are movable relative to one another in the direction of a movement axis, wherein the portions are at least intermittently connected to one another via functional elements with an effective direction at least approximately perpendicular to the movement axis and via functional elements with an effective direction at least approximately parallel to the movement axis.

Further, it is known to capture via an optical encoder a reference pattern that is attached to a mirror. Such an optical encoder supplies voltage signals that the phase-shifted by 90° in relation to one another and are also referred to as A-signal and B-signal, but these phase-shifted voltage signals are susceptible to noise. Moreover, the optical encoder supplies an ambiguous relative position (fine position) in relation to the switch-on position or reference position, but not a unique absolute position (approximate position). Consequently, a further position sensor is used for the switch-on position.

SUMMARY

The disclosure seeks to improve the ascertainment of a position of at least one mirror of a lithography apparatus.

Accordingly, a sensor arrangement is proposed for ascertaining a respective position of a number of mirrors of a lithography apparatus. The sensor arrangement includes a number of position sensor apparatuses, wherein each position sensor apparatus includes a light source for exposing a measuring unit with a modulated light beam, a measuring unit for providing an optical position signal of a position of a mirror during the exposure by the modulated light beam, and a detection unit having a plurality of photodetectors for the output of an electrical position signal by detection of the provided optical position signal, wherein the measuring unit has a reference pattern for influencing the light beam and a mirror arrangement for reflecting the influenced light beam. Moreover, the sensor arrangement has an evaluation apparatus for ascertaining the position of the mirror via the electrical position signal.

The use of the modulated exposure allows a reduction in the power loss and noise properties of the position signal can be influenced positively. Hence, the modulated exposure permits a high signal quality with a low mean power loss.

By way of example, the modulated light beam is a pulsed light beam or a sinusoidal light beam. The sinusoidal light beam has, in particular, a sinusoidal envelope. Hence, the amplitude of the light power can be increased at certain times and reduced at other times. In detail: In order to meet the desired properties of positioning accuracy and noise compensation, a projection system uses e.g. a control clock of approximately 5 kHz. Consequently, the values are supplied to the regulator and sampled at 5 kHz. The A/D converter can operate at a higher sampling rate, in particular if use is also made of digital pre-filters at a higher sampling rate. A stronger and hence lower-noise signal can be obtained by more light power. However, a modulated exposure, for example pulsing or flashes, is advantageous so as not to thermally overload the light source or the light-producing component, such as e.g. a semiconductor laser or a laser diode, and/or so as to keep the power loss, averaged over time, low in the driver circuit for the light source.

Most light-producing elements based on semiconductors can also be operated by a rated current in pulsed operation such that very high light intensities, and hence very good signal-to-noise ratios, can be facilitated. Within certain limits, the operation above the rated current even can be carried out without a reduction, or with an acceptable reduction, in the expected service life. Since the optical position signal is also pulsed in the case of a pulsed exposure, the sampling of the A/D converter is preferably synchronized with the pulses of the light source. Here, the sampling frequency of the A/D converter is equal to or greater than the pulse frequency. In conclusion, the advantage of the modulated a pulsed exposure lies in the fact that more pulse light power and hence an improved signal-to-noise ratio can be achieved.

According to a further embodiment, the light source is configured to generate a pulsed light beam for exposing the measuring unit.

From the signaling theory point of view, the pulsed exposure represents a multiplication by a pulse sequence. Here too, the relevant measurement information accordingly is no longer (only) transported in the baseband (at low frequencies) through the amplifier and a remaining measurement path. A multiplication by the pulse sequence in the time domain (by the pulsed exposure) corresponds to convolution with a pulse sequence in the frequency domain, and so signal contents are also transported at a higher carrier frequency and multiples thereof. Here, the base carrier frequency is the pulse frequency at which the light source is pulsed.

In addition to the high light pulse powers or energies, the pulsed exposure has a further potential for improving the signal-to-noise ratio, particularly in the case of 1/f noise.

According to a further embodiment, the light source is configured to generate a sinusoidal light beam for exposing the measuring unit.

According to a further embodiment, the light source has a light-producing unit for producing a light beam and a modulator unit for generating a modulated light beam from the light beam produced by the light-producing unit.

The modulator unit produces the modulated light beam by impressing a defined characteristic onto the light beam produced by the light-producing unit.

According to a further embodiment, the light source has a light-producing unit for producing a light beam and a pulse generator which is configured to actuate the light-producing unit via a sequence of pulses in such a way that the light-producing unit outputs the modulated light beam with the defined characteristic.

According to a further embodiment, the light-producing unit has a semiconductor laser.

According to a further embodiment, the evaluation apparatus has a signal-processing unit which has at least one A/D converter for converting an analog electrical position sensor that is output by the photodetectors into a digital electrical position signal.

According to a further embodiment, the sensor arrangement includes a synchronization device for synchronizing the signal-processing unit and the light source. By way of example, the synchronization device can be embodied as a pulse generator or as a modulation source.

According to a further embodiment, the pulse generator includes the synchronization device. Here, the pulse generator is configured to synchronize the signal-processing unit and the light source via the sequence of pulses.

According to a further embodiment, the A/D converter of the signal-processing unit includes a sampling unit and a quantization unit, wherein the synchronization unit device is configured to synchronize the sampling unit and the light source for generating the modulated light beam.

According to a further embodiment, the signal-processing unit includes the A/D converter and a signal analysis unit disposed downstream of the A/D converter, wherein the synchronization device is configured to synchronize the signal analysis unit and the light source for generating the modulated light beam.

According to a further embodiment, the A/D converter is configured for multiple sampling of the electrical position signal. In the case of multiple sampling, the electrical position signal is sampled multiple times, i.e. it is sampled at a time and sampled again shortly thereafter (e.g. 1 microsecond thereafter). In particular, the multiple sampling is a method according to correlated double sampling. The method according to correlated double sampling is particularly advantageous in the case of 1/f noise. By way of example, the electrical position signal is sampled twice in the case of multiple sampling, once when the position signal is present and once, briefly thereafter, when no signal is present and hence only noise still is present, e.g. during the pause between two pulses. These two information items can be subtracted from one another. Under the assumption that the noise signal has not changed between the two sampling points (e.g. in the case of 1/f noise), this removes or minimizes the noise.

According to a further embodiment, the signal-processing unit includes the A/D converter and a demodulator disposed upstream of the A/D converter. Here, the synchronization device is configured to synchronize the demodulator and the light source for generating a sinusoidal light beam.

According to a further embodiment, at least the light source and the signal-processing unit are provided in an integrated component that is arranged in a vacuum housing.

An integrated component should be understood to mean an arrangement having a number of integrated circuits and/or parts that are arranged on a carrier printed circuit board or on a plurality of carrier printed circuit boards. The integrated component also can be referred to as integrated sensor electronics.

The signal-processing unit, for example, can be embodied as an integrated circuit. An example of a part arranged on the carrier printed circuit board is the light source. By way of example, the carrier printed circuit board includes a ceramic circuit board.

It is possible to save space by the integration in the same integrated component. By integrating the light source in the integrated component and, hence, in the vacuum housing, it is no longer necessary to guide externally produced light rays through the vacuum housing. This saves costs. The actuation of the light source, too, or, preferably, also the driver circuit for the light source is arranged within the vacuum housing. By way of example, the driver circuit for the light source is integrated in the signal-processing unit.

As a result of the generation of the digital electrical position signal, provided within the vacuum housing, by the A/D converter of the signal-processing unit, it is advantageously possible to use a digital data line for guiding the signals to the outside, i.e. outside of the vacuum housing. Advantageously, the data can be compressed and/or protected by error codes on the digital data line. In particular, the A/D converter includes a sampling unit and a quantization unit, which are integrated on the integrated component.

The production of the digital position signals immediately at the measuring point and hence in the vacuum housing offers advantages in respect of signal integrity and manageability of the system. A reason for this lies in the fact that the position signals can be transported digitally to the outside.

According to a further embodiment, the light source and the signal-processing unit are provided in a single integrated component.

According to a further embodiment, the light source, the signal-processing unit and the photodetectors of the detection unit are provided in the integrated component.

As a result of the light source, the signal-processing unit and, preferably, the photodetectors, too, being provided in the same integrated component, it is possible to establish the position of at least one mirror very quickly. Spatially drawing together the photodetectors and the signal-processing unit, in particular, facilitates very fast signal processing. The shortened signal paths between the photodetectors and the signal-processing unit furthermore bring about the advantages of an improvement in the signal-to-noise ratio and a reduction in the susceptibility to faults. In particular, the integrated component is provided with a layer that protects against outgassing.

According to a further embodiment, the sensor arrangement includes a control apparatus for controlling actuators which are configured to actuate actuatable mirrors of the mirrors of the lithography apparatus.

According to a further embodiment, the control apparatus has the evaluation apparatus.

According to a further embodiment, the detection unit further has an optical unit which is configured to image the optical position signal that is provided by the measuring unit onto the photodetectors. In particular, the optical unit includes at least one lens.

By way of example, the projection system of the lithography apparatus has a number N1 of mirrors with a number N2 of actuatable mirrors (N2≤N1) and N3 position sensor apparatuses. Here, a number N4 of the position sensor apparatuses is respectively assigned to one of the N2 actuatable mirrors (N3=N4·N2). In particular, N1, N2, N3, and N4 are natural numbers.

According to a further embodiment, the sensor arrangement includes a plurality N3 of position sensor apparatuses arranged in the vacuum housing, wherein a respective position sensor apparatus is assigned to one of a plurality N2 of actuatable mirrors of the lithography apparatus, and a data collection apparatus which is arranged in the vacuum housing, which is connected by way of a data link to the evaluation apparatus that is arranged outside of the vacuum housing, and which is configured to collect the N3 digital electrical position signals provided by the N3 position sensor apparatuses to form a digital collective signal and transfer the digital collective signal to the evaluation apparatus via the data link.

Advantageously, the data collection apparatus provides an option for collecting the digital position signals in the vacuum housing and transporting them in a packaged form to the outside. Advantageously, this reduces the cable costs. By way of example, the data collection apparatus is an electronics unit, for example an integrated circuit. A realization with the data collection apparatus addressed is also advantageous in that a digital data cable to the outside is much less rigid than many cables for many analog signals.

According to a further embodiment, the data collection apparatus and the evaluation apparatus are connected via a single data link. The use of a single data link reduces the costs for cables and cable glands through the vacuum housing.

According to a further embodiment, the data link between the data collection apparatus and the evaluation apparatus is embodied as a unidirectional data link.

The use of a unidirectional data link to the outside advantageously prevents access to the data collection apparatus from the outside.

According to a further embodiment, the data link has a vacuum through-connection apparatus for a vacuum-suitable through-connection through the vacuum housing, a first data line coupled between the data collection apparatus and the vacuum through-connection apparatus, and a second data line coupled between the vacuum through-connection apparatus and the evaluation apparatus.

According to a further embodiment, the data collection apparatus is connected to each of the N3 position sensor apparatuses via a respective line.

As a result of this, easily establishable point-to-point data links to the data collection apparatus are realized.

According to a further embodiment, a connector bracket electrically couples the data collection apparatus and the first data line. A connector bracket is an adapter via which the data collection apparatus and the first data line can be coupled mechanically and electrically.

According to a further embodiment, the sensor arrangement includes a plurality N3 of position sensor apparatuses arranged in the vacuum housing, wherein a respective position sensor apparatus is assigned to one of a plurality N2 of actuatable mirrors of the lithography apparatus, and a bus system which is at least partly arranged in the vacuum housing, which is connected to the evaluation apparatus that is arranged outside of the vacuum housing, and which is configured to transfer the N3 digital electrical position signals provided by the N3 position sensor apparatuses to the evaluation apparatus.

In relation to point-to-point connections in the vacuum housing, a vacuum-suitable bus system is particularly advantageous in view of costs and dynamics. Additionally, it is possible to dispense with the data collection apparatus and hence it becomes simpler already to unify bus lines to an even greater extent in the vacuum housing in order to save even more lengths of cable and hence costs.

According to a further embodiment, a portion of the position sensor apparatuses arranged in the vacuum housing share a bus system. The further sensors can be coupled by way of a further bus system or by way of point-to-point connections to a data collection apparatus to be provided in that case. Separate bus systems can be advantageous, in particular, if the bus bandwidth is too low to assist a desired control bandwidth.

According to a further embodiment, the sensor arrangement has a vacuum through-connection apparatus for a vacuum-suitable through-connection of the bus system through the vacuum housing.

According to a further embodiment, the bus system has a plurality of bus lines coupling the position sensor apparatuses, the bus lines being connected to a connector bracket.

According to a further embodiment, the data link has a first data line coupled between the connector bracket and the vacuum through-connection apparatus, and a second data line coupled between the vacuum through-connection apparatus and the evaluation apparatus.

According to a further embodiment, the reference pattern is arranged between the light source and the mirror arrangement.

According to a further embodiment, the reference pattern has a scale, in particular a holographic scale.

According to a further embodiment, the sensor arrangement includes a plurality N3 of position sensor apparatuses arranged in the vacuum housing, wherein a respective position sensor apparatus is assigned to one of a plurality N2 of actuatable mirrors of the lithography apparatus, and an information collection device which is arranged in the vacuum housing, which is connected via a cable to the evaluation apparatus that is arranged outside of the vacuum housing, and which is configured to transfer the N3 electrical position signals provided by the N3 position sensor apparatuses in analog fashion via the cable via time multiplexing or via frequency multiplexing.

By the use of the pulsed light beam and a multiplexing method, in this case time multiplexing or frequency multiplexing, it is possible to transport position signals from a plurality of position sensor apparatuses in analog fashion via a single cable. This saves costs. In particular, simple vacuum electronics in the vacuum housing are possible.

According to a further embodiment, the sensor arrangement includes a plurality N3 of position sensor apparatuses arranged in the vacuum housing, wherein a respective position sensor apparatus is assigned to one of a plurality N2 of actuatable mirrors of the lithography apparatus, and an information collection device which is arranged in the vacuum housing, which is connected via a cable to the evaluation apparatus that is arranged outside of the vacuum housing, and which is configured to transfer the N3 electrical position signals provided by the N3 position sensor apparatuses in analog fashion via the cable via frequency multiplexing.

By the use of the sinusoidal light beam and a multiplexing method, in this case frequency multiplexing, it is possible to transport position signals from a plurality of position sensor apparatuses in analog fashion via a single cable. This saves costs. In particular, simple vacuum electronics in the vacuum housing are possible.

Further, a projection system of a lithography apparatus is proposed, including a plurality N1 of mirrors, which includes a number N2 of actuatable mirrors, where N2≤N1, and a sensor arrangement as described above. The sensor arrangement includes a plurality N3 of position sensor apparatuses, wherein respectively a number N4 of the position sensor apparatuses are assigned to one of the N2 actuatable mirrors, where N3=N4·N2.

According to an embodiment, the projection system includes a plurality of actuators for actuating the actuatable mirrors and a control apparatus for controlling the actuators.

According to a further embodiment, the control apparatus has the evaluation apparatus. In particular, the control apparatus integrates the evaluation apparatus.

According to a further embodiment, the evaluation apparatus is configured to determine a respective position for each of the N2 actuatable mirrors depending on the respective digital electrical position signal.

According to a further embodiment, the control apparatus is configured to actuate the actuators depending on the positions, determined by the evaluation apparatus, of the actuatable mirrors.

Here, in particular, the control apparatus uses a model-supported closed-loop control in order to improve the quality of the measured values in respect of noise. By way of example, a model of the control loop, which e.g. reproduces the mirrors of the projection system and the actuators thereof, can run within a Kalman filter and consequently improve the measured values available for the regulator by the model assistance.

Instead of a conventional Kalman filter, the control apparatus can also use specific nonlinear variants of the Kalman filter. Examples of this are a linear Kalman filter with piecewise linear models, an extended Kalman filter or a Kalman filter with error back propagation. In the case of sufficient computational power and memory capacity, the use of a particle filter may also be advantageous, particularly in the case of the nonlinear behavior and extraordinary probability densities, for example in the case of a multimodal distribution of the raw measured signals from the mirrors of the projection system.

According to a further embodiment, the projection system includes a power supply apparatus for supplying the sensor arrangement arranged in the vacuum housing with electrical power.

Furthermore, a lithography apparatus which has a projection system as described in more detail above is proposed.

Moreover, a method is proposed for ascertaining a respective position of a number of mirrors of a lithography apparatus. It has the following steps a) to c):

a) exposing a measuring unit with a modulated light beam by a light source,
b) detecting by way of a detection unit an optical position signal that is provided by the measuring unit when same is exposed by the modulated light beam, for the output of an electrical position signal, wherein the measuring unit has a reference pattern for influencing the light beam and a mirror arrangement for reflecting the influenced light beam, and
c) ascertaining the position of the mirror via the electrical position signal.

According to an embodiment, steps a) and b) and preferably, additionally, step c) are carried out by an integrated component arranged in a vacuum housing, the integrated component integrating the light source and the detection unit.

The embodiments and features described for the proposed apparatus are correspondingly applicable to the proposed method.

Furthermore, a computer program product is proposed, the computer program product prompting steps a) to c) of the method as explained above to be carried out on a program-controlled device.

A computer program product, such as e.g. a computer program means, can be provided or supplied, for example, as a storage medium, such as e.g. a memory card, a USB stick, a CD-ROM, a DVD, or else in the form of a downloadable file from a server in a network. By way of example, in the case of a wireless communications network, this can be effectuated by transferring an appropriate file with the computer program product or the computer program means.

Further possible implementations of the invention also include not explicitly mentioned combinations of features or embodiments that are described above or below with respect to the exemplary embodiments. In this respect, a person skilled in the art will also add individual aspects to the respective basic form of the invention as improvements or additions.

BRIEF DESCRIPTION OF THE DRAWINGS

Further advantageous configurations and aspects of the invention are the subject of the dependent claims and also of the exemplary embodiments of the invention described below. In the text that follows, the invention is explained in more detail on the basis of preferred embodiments with reference to the accompanying figures.

DETAILED DESCRIPTION

Identical elements or elements having an identical function have been provided with the same reference signs in the figures, provided nothing else is indicated. It should also be noted that the illustrations in the figures are not necessarily to scale.

Figure 1:
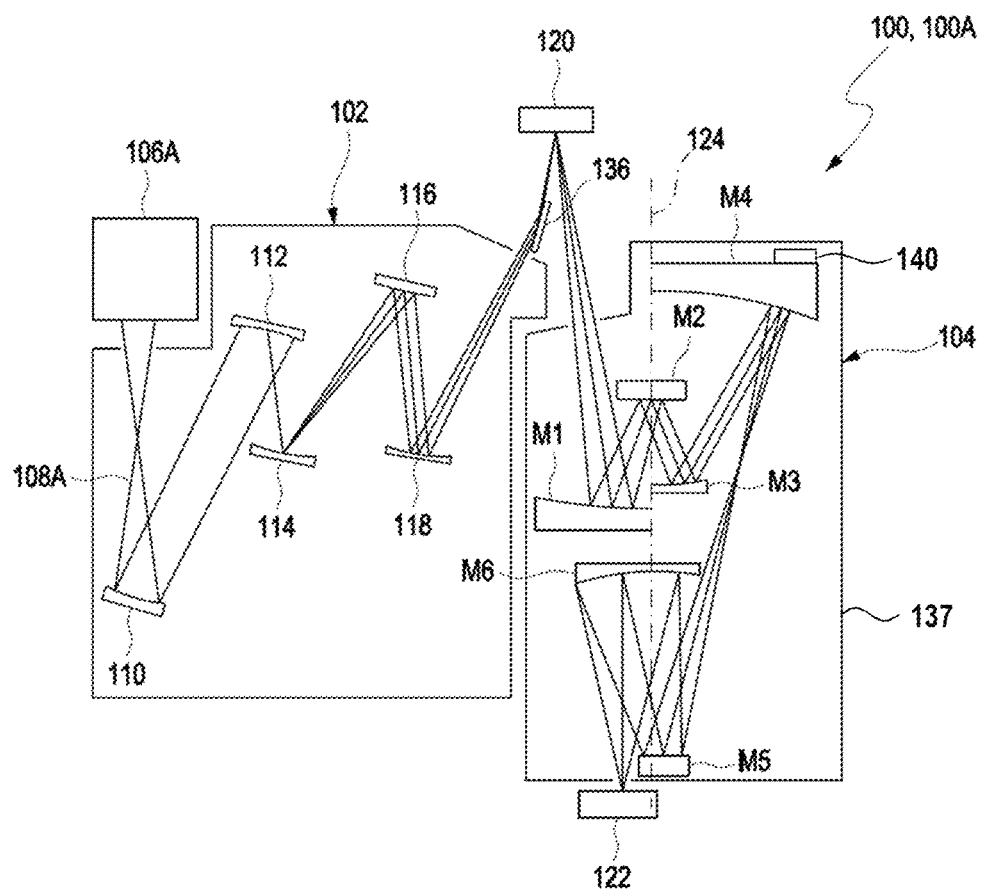
FIG. 1 shows a schematic view of an EUV lithography apparatus.

FIG. 1 shows a schematic view of an EUV lithography apparatus 100A, which includes a beam-shaping and illumination system 102 and a projection system 104. EUV stands for "extreme ultraviolet" and refers to a wavelength of the operating light of between 0.1 and 30 nm. The beam-shaping and illumination system 102 and the projection system 104 are respectively provided in a vacuum housing, each vacuum housing being evacuated with the aid of an evacuation apparatus that is not represented any more specifically. The vacuum housings are surrounded by a machine room not illustrated in any more detail. Electrical controllers and the like can also be provided in this machine room.

The EUV lithography apparatus 100A includes an EUV light source 106A. A plasma source which emits radiation 108A in the EUV range (extreme ultraviolet range), that is to say for example in the wavelength range of 5 nm to 30 nm, may for example be provided as the EUV light source 106A. In the beam-shaping and illumination system 102, the EUV radiation 108A is focused and the desired operating wavelength is filtered out from the EUV radiation 108A. The EUV radiation 108A produced by the EUV light source 106A has a relatively low transmissivity through air, for which reason the beam guiding spaces in the beam shaping and illumination system 102 and in the projection system 104 are evacuated.

The beam-shaping and illumination system 102 illustrated in FIG. 1 has five mirrors 110, 112, 114, 116, 118. After passing through the beam shaping and illumination system 102, the EUV radiation 108A is directed onto the reticle 120. The reticle 120 is likewise formed as a reflective optical element and can be arranged outside the systems 102, 104. Furthermore, the EUV radiation 108A may be steered onto the reticle via a mirror 136. The reticle 120 has a structure which is imaged onto a wafer 122 or the like in a reduced fashion via the projection system 104.

The projection system 104 has six mirrors M1-M6 for imaging the reticle 120 onto the wafer 122. In this case, individual mirrors M1-M6 of the projection system 104 may be arranged symmetrically in relation to the optical axis 124 of the projection system 104. It should be noted that the number of mirrors of the EUV lithography apparatus 100A is not restricted to the number represented. A greater or lesser number of mirrors can also be provided. Furthermore, the mirrors M1-M6 are generally curved on their front side for beam shaping.

The projection system 104 further has a number of position sensor apparatuses 140 for determining a position of one of the mirrors M1-M6.

On the exemplary assumption that the projection system 104 has six mirrors M1-M6 (N1=6), of which five mirrors can be actuated (N2=5) and each of the actuatable mirrors can be assigned six position sensor apparatuses 140 (N4=6) corresponding to six degrees of freedom, a number N3 of the position sensor apparatuses 140 in the projection system 104 of 30 is obtained (N3=N4·N2=6·5=30).

Without loss of generality and for reasons of a simplified illustration, FIG. 1 shows one position sensor apparatus 140.

Figure 2:
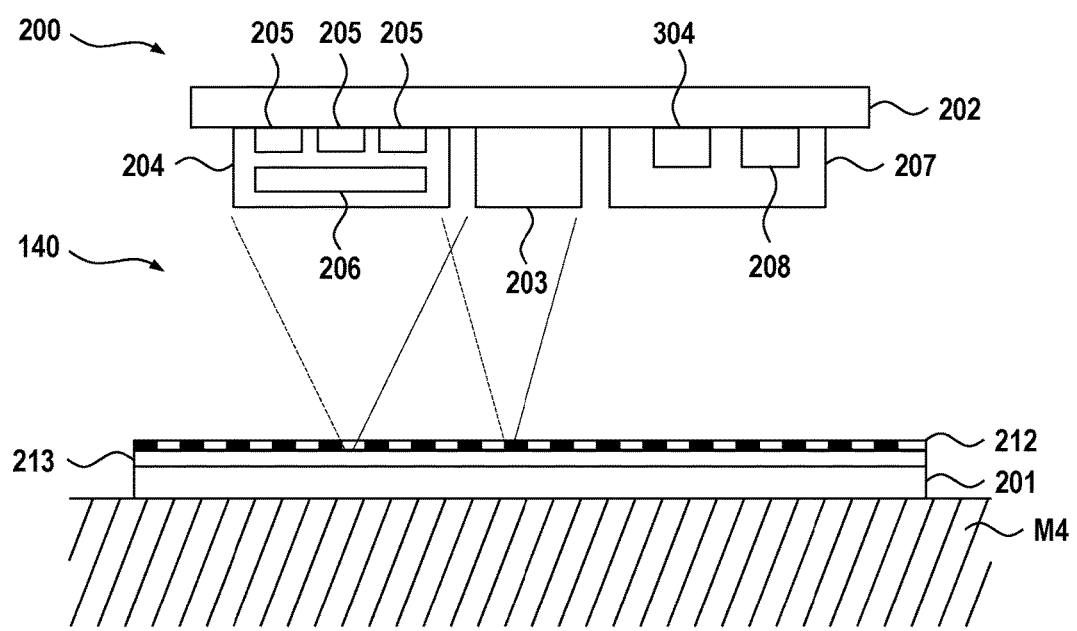
FIG. 2 shows a schematic view of an embodiment of a sensor arrangement having a position sensor apparatus for ascertaining a position of at least one mirror of the lithography apparatus.
Figure 3:
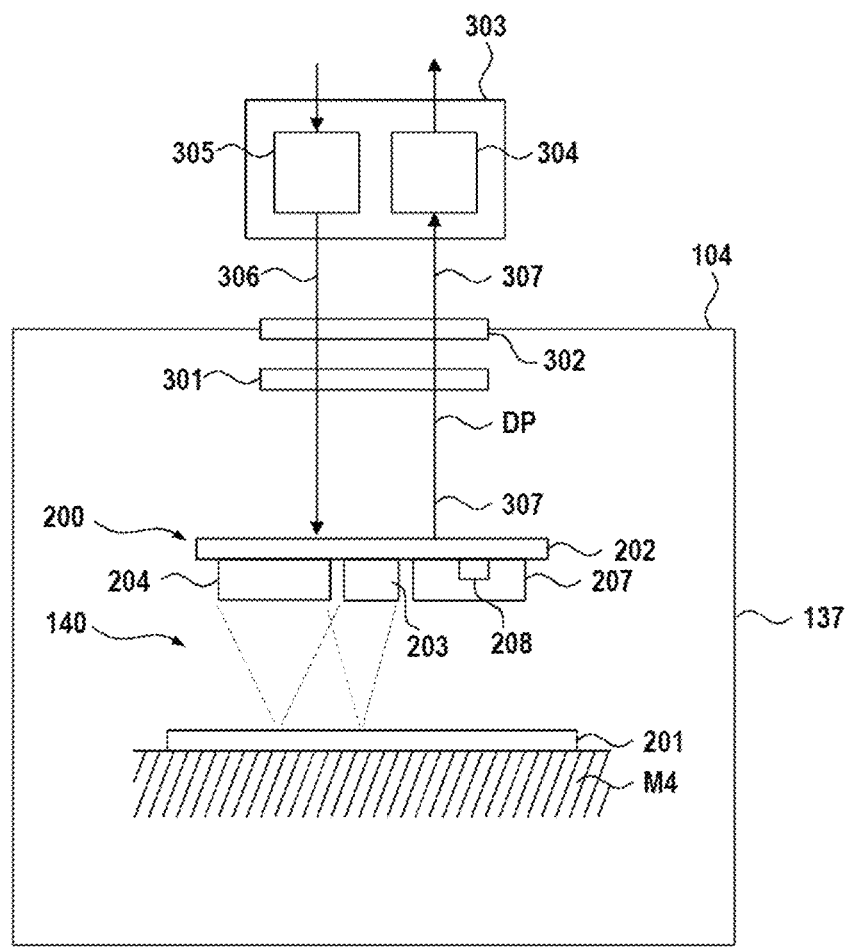
FIG. 3 shows a schematic view of an embodiment of a projection system having an assigned control apparatus.

The position sensor apparatus 140 is coupled to an evaluation apparatus 304 (see FIGS. 2 and 3). The evaluation apparatus 304 is configured to determine the position of an actuatable mirror of the mirrors M1-M6 via the output signal of the position sensor apparatus 140. The evaluation apparatus 304—like the position sensor apparatus 140—may be arranged in the vacuum housing 137 of the projection system 104 (see FIG. 2). In this case, the evaluation apparatus 304 is integrated, for example, in the signal-processing unit 207. Alternatively, the evaluation apparatus 304 also may be arranged outside of the vacuum housing 137 of the projection system 104. By way of example, the evaluation apparatus 304 then can be integrated in a control apparatus 303 assigned to the projection system 104 (see e.g. FIG. 3).

Details in respect of the position sensor apparatus 140 are described in more detail with reference to FIGS. 2 to 15.

To this end, FIG. 2 shows a schematic view of an embodiment of a sensor arrangement having a position sensor apparatus 140 for ascertaining a position of a mirror of the lithography apparatus, for example of the mirror M4 of the projection system 104 of the lithography apparatus 100.

Figure 7:
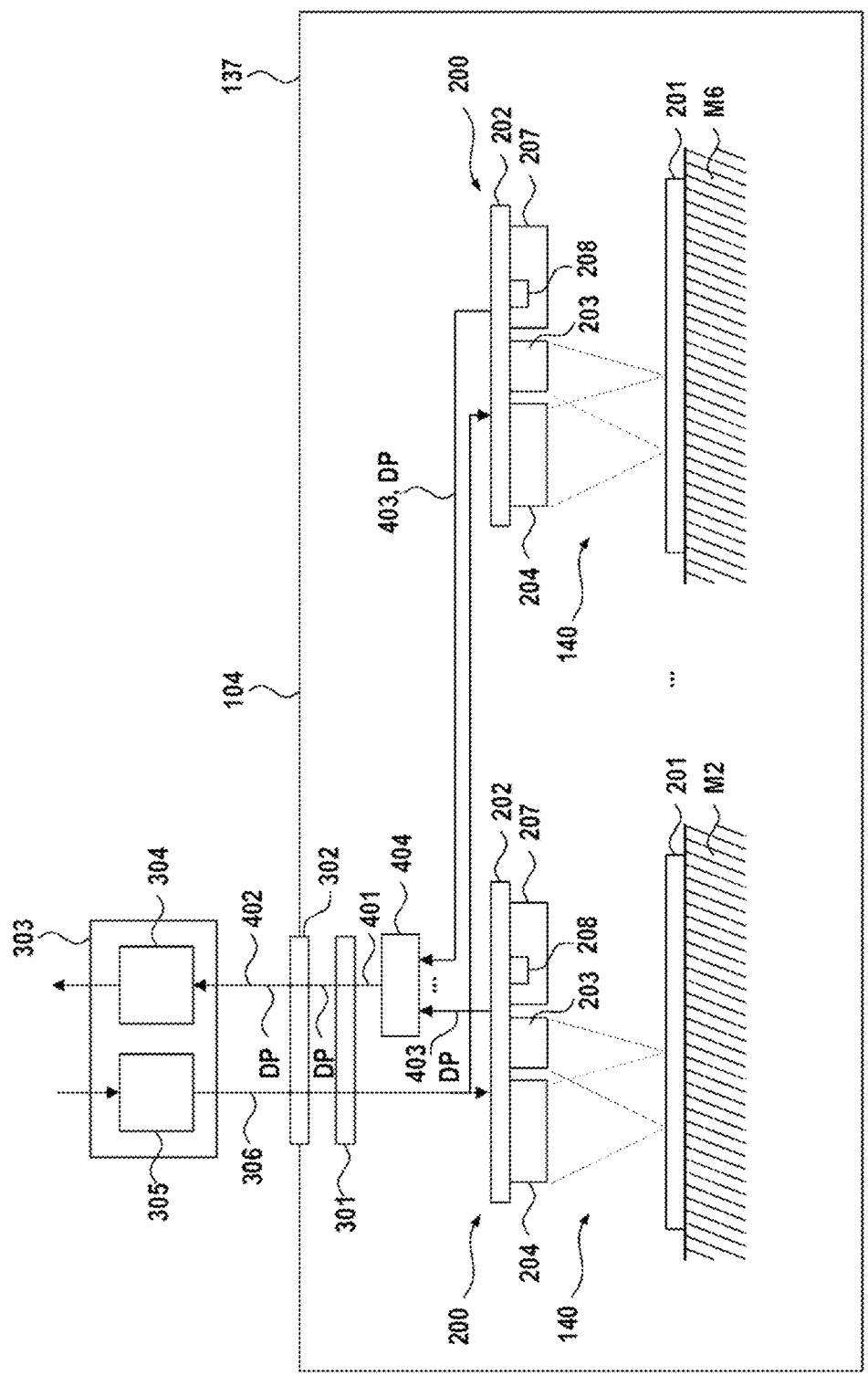
FIG. 7 shows a schematic view of a further embodiment of a projection system having an assigned control apparatus.

The sensor arrangement of FIG. 2 includes a number of position sensor apparatuses 140. Without loss of generality, FIG. 2 shows a position sensor apparatus 140 for ascertaining a position of a mirror of the lithography apparatus, for example of the mirror M4 of the projection system 104 of the lithography apparatus 100. By way of example, FIG. 7 illustrates a plurality of position sensor apparatuses 140 for ascertaining the respective position of a plurality of mirrors M2-M6.

The position sensor apparatus 140 of FIG. 2 comprises a measuring unit 201, a light source 203, a detection unit 204 and a signal-processing unit 207. The measuring unit 201 includes a reference pattern 212 and a mirror arrangement 213.

The measuring unit 201 is configured to provide an optical position signal for the position of the mirror M4 in the case of exposure by a modulated light beam. By way of example, the modulated light beam is a pulsed light beam or a sinusoidal light beam. The light source 203 is configured to expose the measuring unit 201 with the modulated light beam. The detection unit 204 includes a plurality of photodetectors 205 for outputting an analog electrical position signal by detecting the provided optical position signal. Without loss of generality, FIG. 2 shows three photodetectors 205. The signal-processing unit 207 includes at least one A/D converter 208 for converting the analog electrical position signal into a digital electrical position signal.

The sensor arrangement further includes an evaluation apparatus 304 for ascertaining the position of the mirror M4 via the digital electrical position signal. In the embodiment of FIG. 2, the evaluation apparatus 304 is integrated into the signal-processing unit 207.

Further, the light source 203, the photodetectors 205 of the detection unit 204, and the signal-processing unit 207 are arranged on a carrier printed circuit board 202 and part of an integrated component 200 in the embodiment of FIG. 2. The integrated component 200 can be provided, at least in part, with a layer protecting against outgassing. By way of example, the light source 203 includes a semiconductor laser. By way of example, the carrier printed circuit board 202 is manufactured from ceramics. Further, blocking capacitors (not shown) may be arranged on the printed circuit board 202. The blocking capacitors are provided, in particular, with a layer that protects against outgassing.

Moreover, FIG. 2 shows that the detection unit 204 has an optical unit 206 which is configured to image the optical position signal that is provided by the measuring unit 201 onto the photodetectors 205. By way of example, the optical unit 206 includes at least one lens.

FIG. 3 shows a schematic view of an embodiment of a projection system 104 having an assigned control apparatus 303. For reasons of clarity, FIG. 3 does not show all mirrors M1-M6 of FIG. 1, but only a single mirror M4 in an exemplary manner. In particular, six position sensor apparatuses 140 are assigned to this mirror M4, with FIG. 3, in turn, only showing one position sensor apparatus 140 for reasons of clarity. The position sensor apparatus 140 of FIG. 3 corresponds to the position sensor apparatus 140 of FIG. 2. However, the evaluation apparatus 304 of FIG. 3 is not arranged in the vacuum housing 137 of the projection system 104 but instead it is integrated in the control apparatus 303 of the projection system 104. The signal-processing unit 207 transfers the digital position signal DP via data lines 307, a connection bracket 301, and a vacuum through-connection apparatus 302 to the evaluation apparatus 304.

Further, FIG. 3 shows an electrical voltage supply 305 provided in the control apparatus 303, the electrical voltage supply supplying the position sensor apparatus 140 with electrical power by way of an electrical voltage supply line 306.

Figure 4:
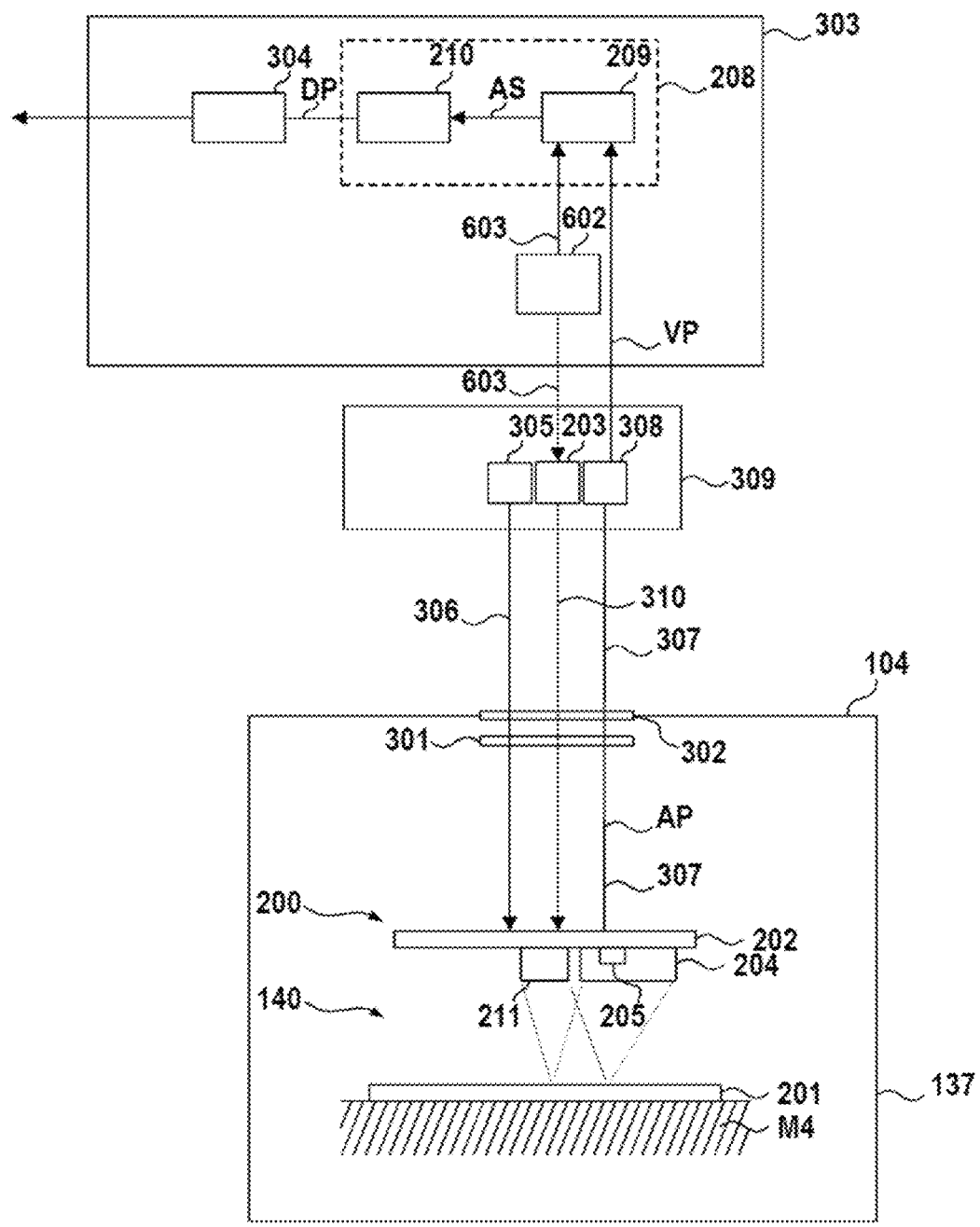
FIG. 4 shows a schematic view of a further embodiment of a projection system having an assigned control apparatus.

FIG. 4 shows a schematic view of a further embodiment of a projection system 104 having an assigned control apparatus 303. A substantial difference between the embodiment of FIG. 4 and the embodiment of FIG. 3 lies in the fact that the light source 203 of FIG. 4 is arranged outside of the vacuum housing 137 of the projection system 104. In contrast thereto, the embodiment of FIG. 4 shows sensor electronics 309 which have the light source 203, the power supply apparatus 305, and an amplifier 308. The power supply apparatus or electrical voltage supply 305 of FIG. 4 supplies the position sensor apparatus 140 with electrical power by way of an electrical voltage supply line 306. The light source 203 of FIG. 4 supplies the modulated light beam 203 into the vacuum housing 137 via a number of optical fibers 310, which are guided through the vacuum through-connection apparatus 302 and the connection bracket 301 to the position sensor apparatus 140. Further, an optical unit 211 is arranged in the vacuum housing 137, the optical unit output coupling the modulated light beam and exposing the measuring unit 201 with the output coupled, modulated light beam. For reasons of clarity and without loss of generality, FIG. 4 shows one optical fiber 310.

Like in the embodiments above, the measuring unit 210 of FIG. 4 is configured to provide an optical position signal for the position of the mirror M4 upon exposure by the modulated light beam produced by the light source 203. The photodetectors 205 of the detection unit 204 output an analog electrical position signal AP by detecting the optical position signal provided by the measuring unit 201 and they are configured to transfer the analog electrical position signal AP via the data line 307, the connection bracket 301 and the vacuum through-connection apparatus 302 to the sensor electronics 309. The amplifier 308 of the sensor electronics 309 is configured to amplify the received analog electrical position signal AP and output an amplified analog position signal VP to the control apparatus 303 that is disposed downstream thereof.

The amplified analog electrical position signal VP is provided for the A/D converter 208 of the control apparatus 303. The A/D converter 208 includes a sampling unit 209 for sampling the amplified analog electrical position signal VP and a quantization unit 210, disposed downstream thereof, for quantizing the sampled signal AS. The evaluation device 304, disposed downstream thereof, determines the position of the mirror M4 depending on the sampled and quantized signal DP.

Figure 5:
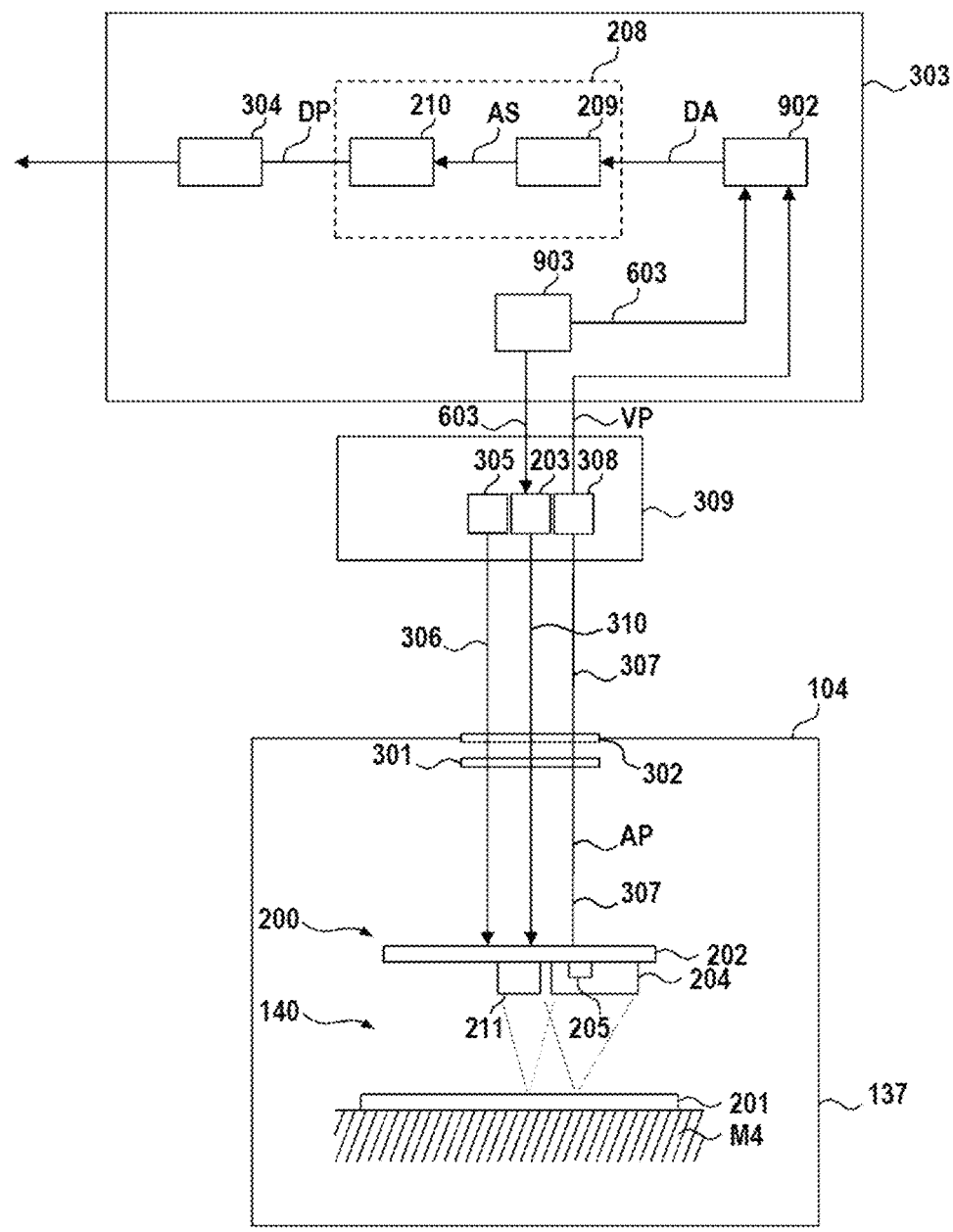
FIG. 5 shows a schematic view of a further embodiment of a projection system having an assigned control apparatus.

The control apparatus 303 further has a pulse generator 602 which is configured to output a synchronization signal 603. The pulse generator 602 synchronizes the sampling unit 209 of the A/D converter 208 and the light source 203 via the synchronization signal 603. FIG. 5 shows a schematic view of a further embodiment of a projection system 104 having an assigned control apparatus 303. The embodiment of the sensor arrangement of FIG. 5 is based on the embodiment of FIG. 4.

The control apparatus 303 of FIG. 5 includes a demodulator 902, which is disposed upstream of the A/D converter 208, and a modulation source 903. The modulation source 903 outputs a sinusoidal modulation signal 603. The modulation source 903 is configured to actuate the light source 203 with the sinusoidal modulation signal in such a way that the light source 203 emits a sinusoidal light beam to the position sensor apparatus 140. Further, the modulation source 903 is configured to synchronize the demodulator 902 of the control apparatus 303 and the light source 203 via the sinusoidal modulation signal 603. Consequently, the light source 203 and the demodulator 902 are synchronized to one another via the sinusoidal modulation signal.

The demodulator 902 receives the amplified analog position signal VP from the amplifier 308 of the sensor electronics 309, demodulates the amplified analog position signal and outputs a demodulated analog position signal DA to the sampling unit 209 of the A/D converter 208.

Figure 6:
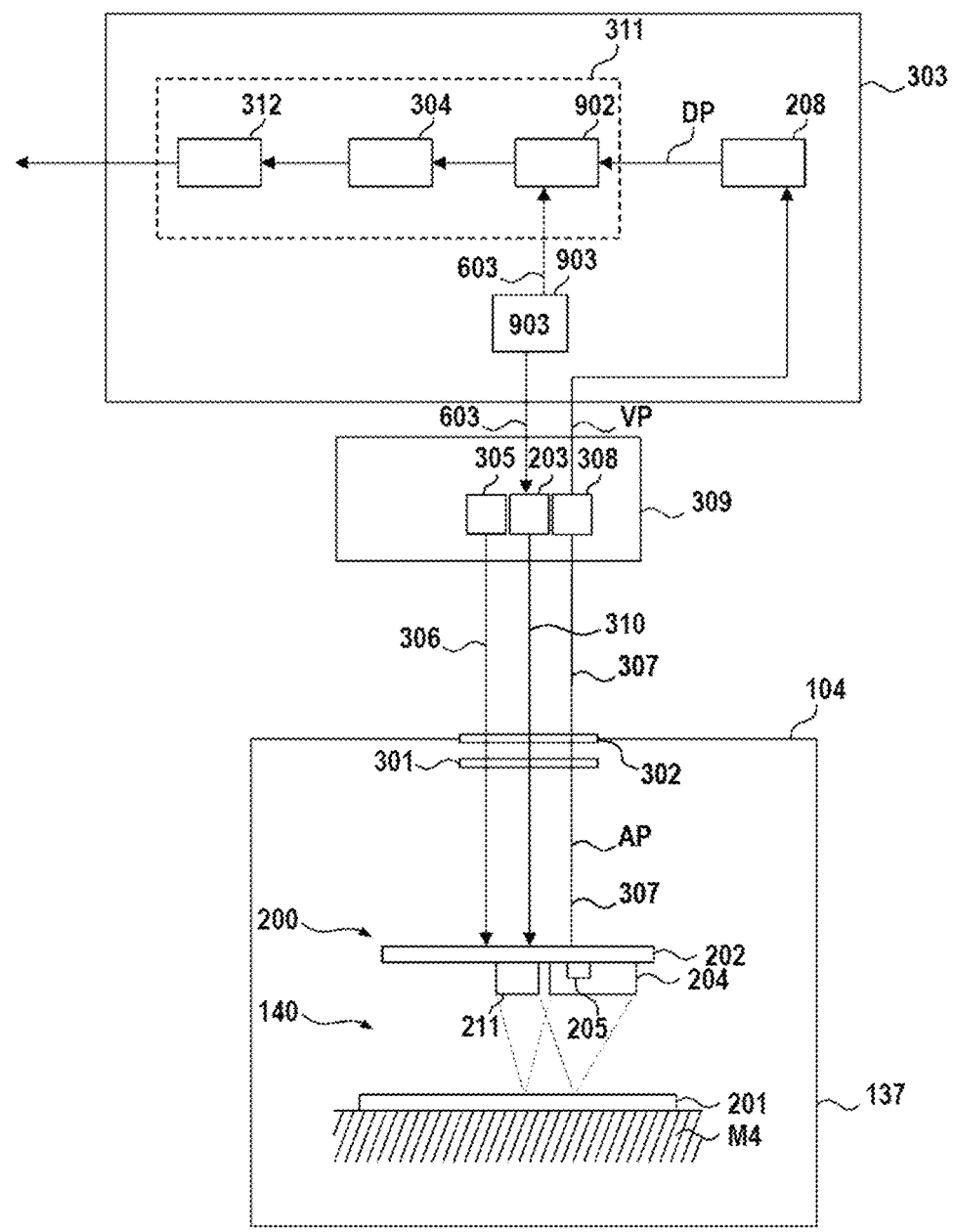
FIG. 6 shows a schematic view of a further embodiment of a projection system having an assigned control apparatus.

FIG. 6 reproduces a schematic view of a further embodiment of a projection system 104 having an assigned control apparatus 303. The embodiment of the sensor arrangement according to FIG. 6 differs from the embodiment according to FIG. 5 in terms of the embodiment of the control apparatus 303. In the embodiment of FIG. 6, the A/D converter 208 of the control apparatus 303 receives the amplified analog position signal VP from the sensor electronics 309 and converts the amplified analog position signal into a digital position signal DP. The digital position signal DP is fed to e.g. an FPGA 311, which includes a demodulator 902, the evaluation apparatus 304 and a driver unit at 312 for driving the actuators of the mirrors M1-M6. As shown by the dashed arrow between the modulation source 903 and the demodulator 902 of FIG. 6, the demodulator 902 optionally can be synchronized via the sinusoidal modulation signal 602. This is not necessary if the carrier frequency of the sinusoidal modulation signal 902 is known a priori to the demodulator 902. The demodulated digital position signal is supplied to the evaluation apparatus 304, which determines the position of the mirror M4 depending on the demodulated digital position signal. The output signal of the evaluation apparatus 304 is supplied to the driver unit 312 which can actuate the actuators for the mirror depending on the received signal of the evaluation apparatus 304.

FIG. 7 shows a schematic view of a further embodiment of a projection system 104 having an assigned control apparatus 303. The sensor arrangement of FIG. 7 includes a multiplicity N3 of position sensor apparatuses 140 arranged in the vacuum housing 137, wherein a respective position sensor apparatus 140 is assigned to one of a plurality N2 of actuatable mirrors M2-M6 of the lithography apparatus 100 of the projection system 104. The respective position sensor apparatus 140 of FIG. 7 corresponds to that of FIG. 2. Five mirrors M2-M6 are actuatable in the example of FIG. 7 (N2=5). Further, six position sensor apparatuses 140 are assigned to each of the five actuatable mirrors M2-M5 according to the six degrees of freedom (N3=6·N2=30). For reasons of clarity, only one position sensor apparatus 140 assigned to an actuatable mirror M2-M6 is respectively imaged in FIG. 7. The evaluation apparatus 304 is integrated in the control apparatus 303 in the embodiment of FIG. 7—like in the embodiment of FIG. 3.

Further, the sensor arrangement of FIG. 7 has a data collection apparatus 404 that is arranged in the vacuum housing 137. The data collection apparatus 404 is connected to the evaluation apparatus 304 arranged outside of the vacuum housing 137 via a data link. The data collection apparatus 404 is configured to collect the M3 digital position signals DP provided by the N3 position sensor apparatuses 140 to form a digital collective signal DS and to transfer the digital collective signal DS to the evaluation apparatus 304 via the data link.

Preferably, and as illustrated in FIG. 7, the data collection apparatus 404 and the evaluation apparatus 304 are connected by way of a single data link. The data link can be embodied as a unidirectional data link. The data link includes a vacuum through-connection apparatus 302 for a vacuum-suitable through-connection through the vacuum housing 137, a first data line 401 coupled between the data collection apparatus 404 and the vacuum through-connection apparatus 302, and a second data line 402 coupled between the vacuum through-connection apparatus 302 and the evaluation apparatus 304.

Figure 8:
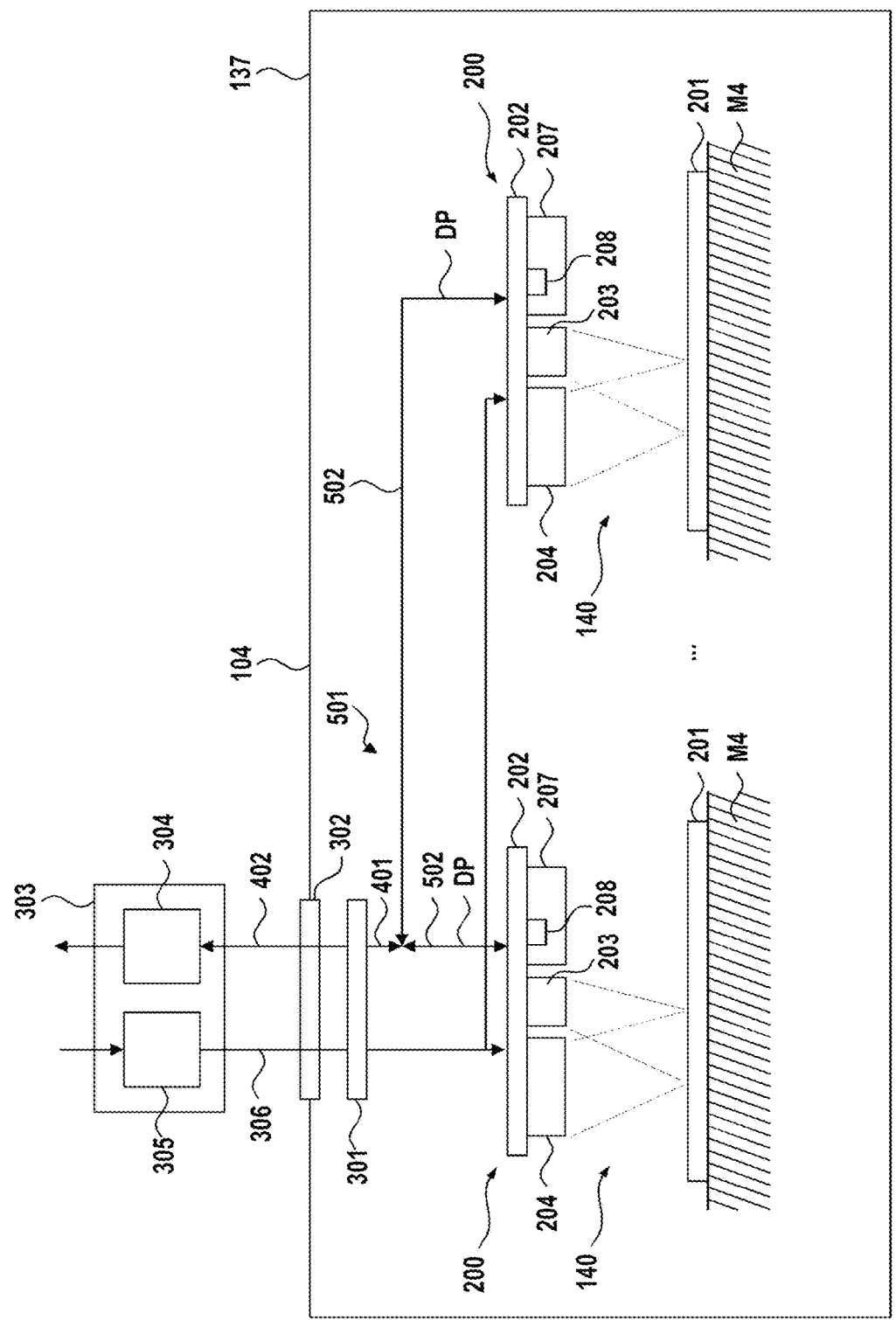
FIG. 8 shows a schematic view of a further embodiment of a projection system having an assigned control apparatus.

FIG. 8 shows a schematic view of a further embodiment of a projection system 104 having an assigned control apparatus 303. The embodiment of FIG. 8 differs from that of FIG. 7 to the extent that the sensor arrangement of FIG. 8 has a bus system 501 instead of a data collection apparatus 404. The bus system 501 is connected to the evaluation apparatus 304 arranged outside of the vacuum housing 137. The bus system 501 is configured to transfer the N3 digital electrical position signals DP provided by the N3 position sensor apparatuses 140 to the evaluation apparatus 304. The vacuum through-connection apparatus 302 of FIG. 8 is configured for a vacuum-suitable through-connection of the bus system 501 through the vacuum housing 137. The bus system 501 of FIG. 8 includes a plurality of bus lines 502 coupling the position sensor apparatus 140, the bus lines being connected to the connector bracket 301.

Figure 9:
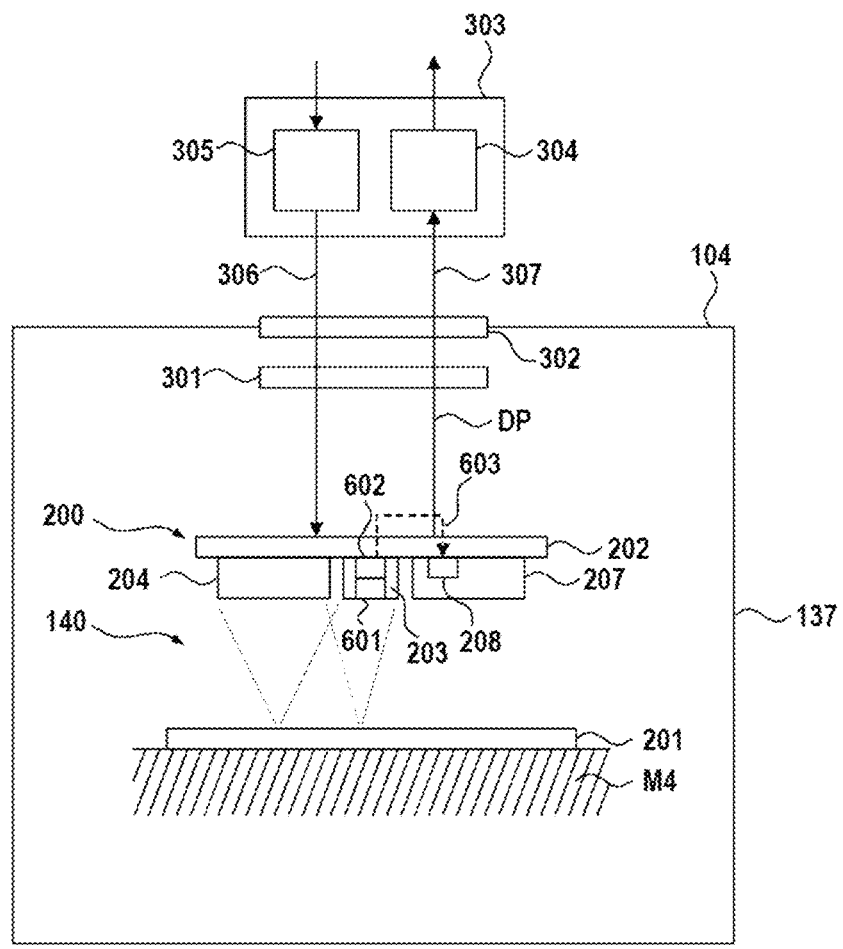
FIG. 9 shows a schematic view of a further embodiment of a projection system having an assigned control apparatus.

FIG. 9 shows a schematic view of a further embodiment of a projection system 104 having an assigned control apparatus 303. The embodiment of the sensor arrangement of FIG. 9 is based on the embodiment of FIG. 3. Further, the light source 203 of FIG. 9 includes a light-producing unit 601 for producing a light beam, and a pulse generator 602. The pulse generator 602 is configured to actuate the light-producing unit 601 via a sequence of pulses in such a way that the light-producing unit 601 exposes the measuring unit 201 with a modulated light beam, for example with a pulsed light beam. Further, the pulse generator 602 outputs a synchronization signal 603, which e.g. corresponds to, or is derived from, the generated sequence of pulses, to the signal-processing unit 207. The signal-processing unit 207 synchronizes the A/D converter 208 via the synchronization signal 603.

The optical position signal may have two mutually phase-shifted signal portions. Accordingly, the detection unit 204 supplies voltage signals that are phase-shifted by 90° to one another as an analog electrical position signal. These phase-shifted low-voltage signals also may be referred to as A-signal and B-signal.

Figure 10:
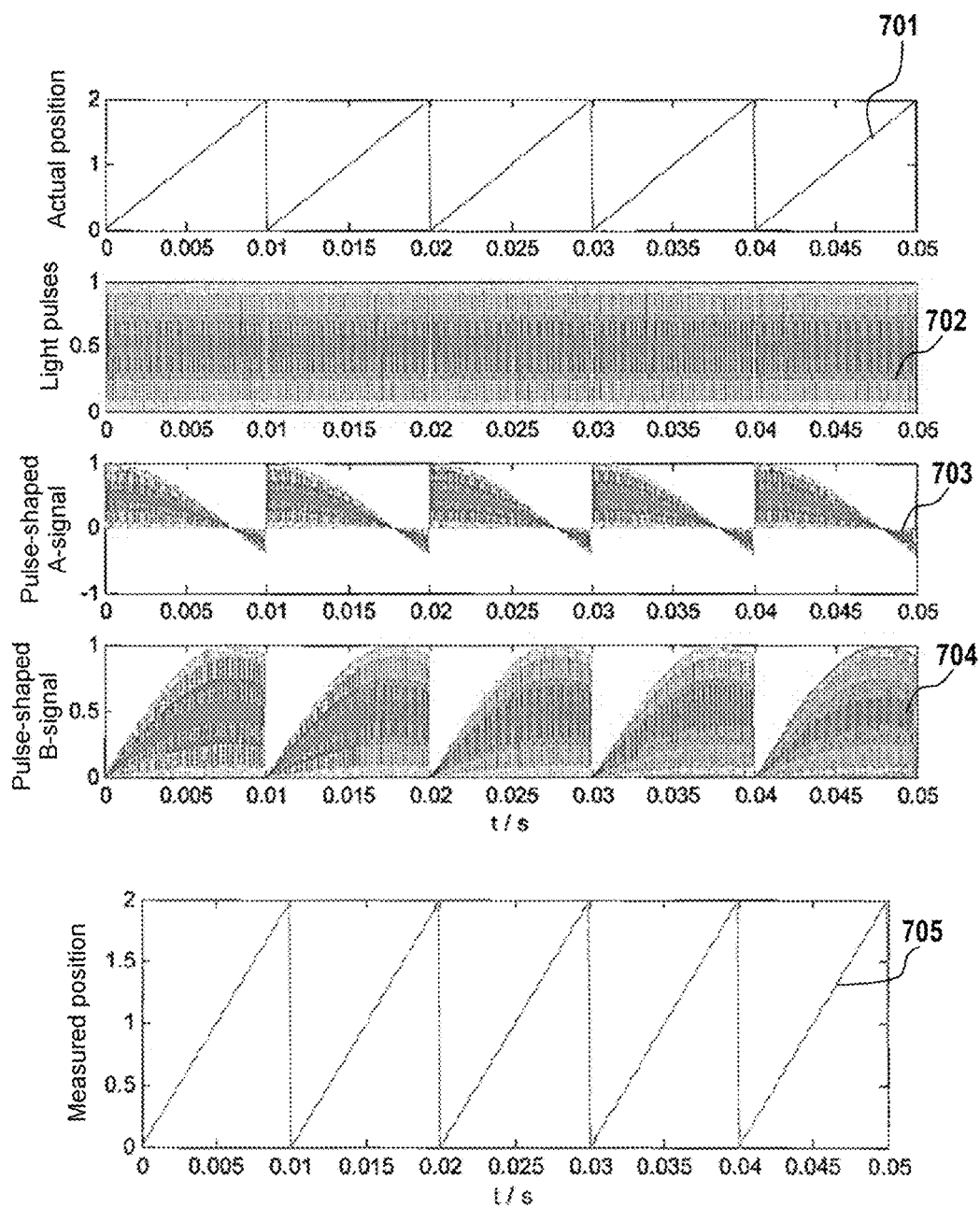
FIG. 10 shows simulation results for a pulsed exposure in the projection system of FIG. 9.

To this end, FIG. 10 shows simulation results in the case of a pulsed exposure for the projection system 104 of FIG. 9. Here, the curve 701 shows the actual fine position (actual position)×of the mirror (in normalized form). The curve 702 shows the light pulses, the curve 703 shows the A-signal, whereas the curve 704 shows the B-signal. Furthermore, the curve 705 shows the measured fine position of the mirror (in normalized form).

Hence, it is possible to identify from FIG. 10 that the A- and B-signals 703, 704, which have a position dependence according to $(A, B)^T=(\cos(x), \sin(x))^T$, are likewise pulsed. By way of example, the position signal to be measured may be obtained back, however, by pulse-synchronous sampling with a subsequent inverse tangent calculation (see curve 705).

In order to be able to resolve individual pulses in the A- and B-signals 703, 704, use is made, preferably, of corresponding amplifiers with a high bandwidth. By way of suitable measures in the evaluation apparatus 304 (evaluation electronics) disposed downstream thereof, it is, however, also possible to correctly evaluate pulses that are deformed by bandwidth limitation. By way of example, it is possible to evaluate pulse integrals in the A- and B-signals 703, 704 instead of directly carrying out the evaluation of the current amplitude. The integration of the signals can be effectuated in analog fashion or, if use is made of fast A/D converters, in digital fashion. From a signaling point of view, the digital variant is more advantageous.

Figure 11:
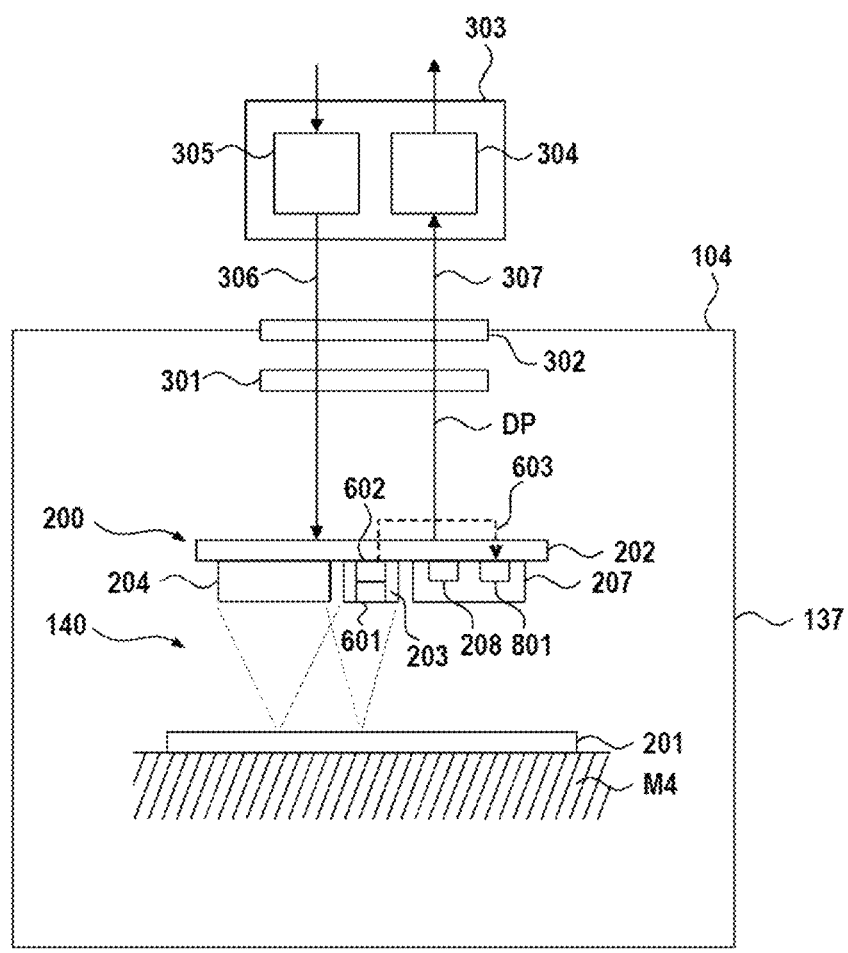
FIG. 11 shows a schematic view of a further embodiment of a projection system having an assigned control apparatus.

FIG. 11 shows a schematic view of a further embodiment of a projection system 104 having an assigned control apparatus 303. The embodiment of the sensor arrangement of FIG. 11 is based on the embodiment of FIG. 9. The signal-processing unit 207 of FIG. 11 further includes a signal analysis unit 801. The signal analysis unit 801 is disposed downstream of the A/D converter 208 in the signal-processing unit 207. In the embodiment of FIG. 11, it is not the A/D converter 208 but the signal analysis unit 801 disposed downstream thereof that is synchronized with the synchronization signal 603.

As explained above, the light source 203 can be configured to produce a modulated light beam, for example a sinusoidal light beam. This is advantageous in that the position information is shifted toward the carrier frequency and consequently can also pass through the amplifier- and cable path in a frequency band around the carrier frequency instead of in the low-frequency baseband.

Figure 12:
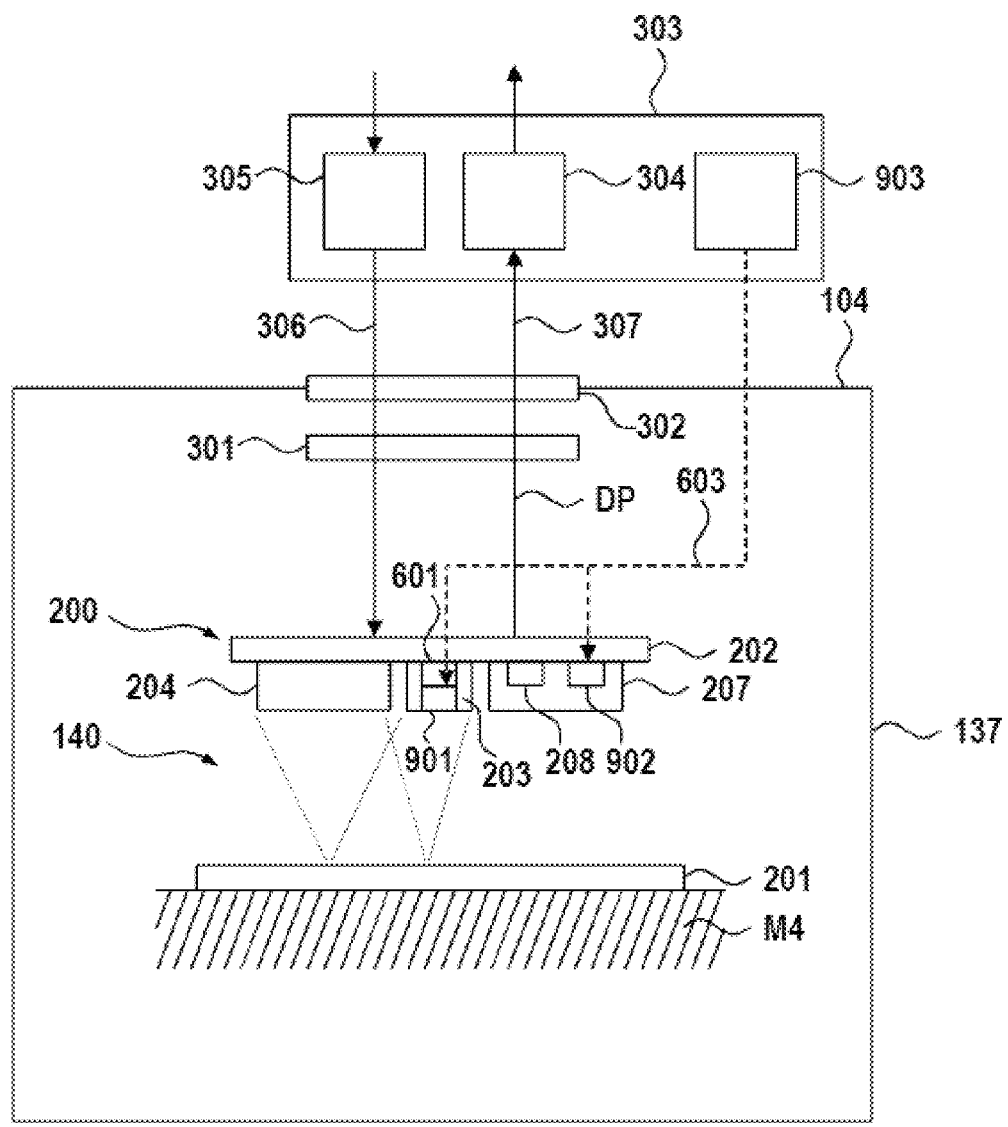
FIG. 12 shows a schematic view of a further embodiment of a projection system having an assigned control apparatus.
Figure 15:
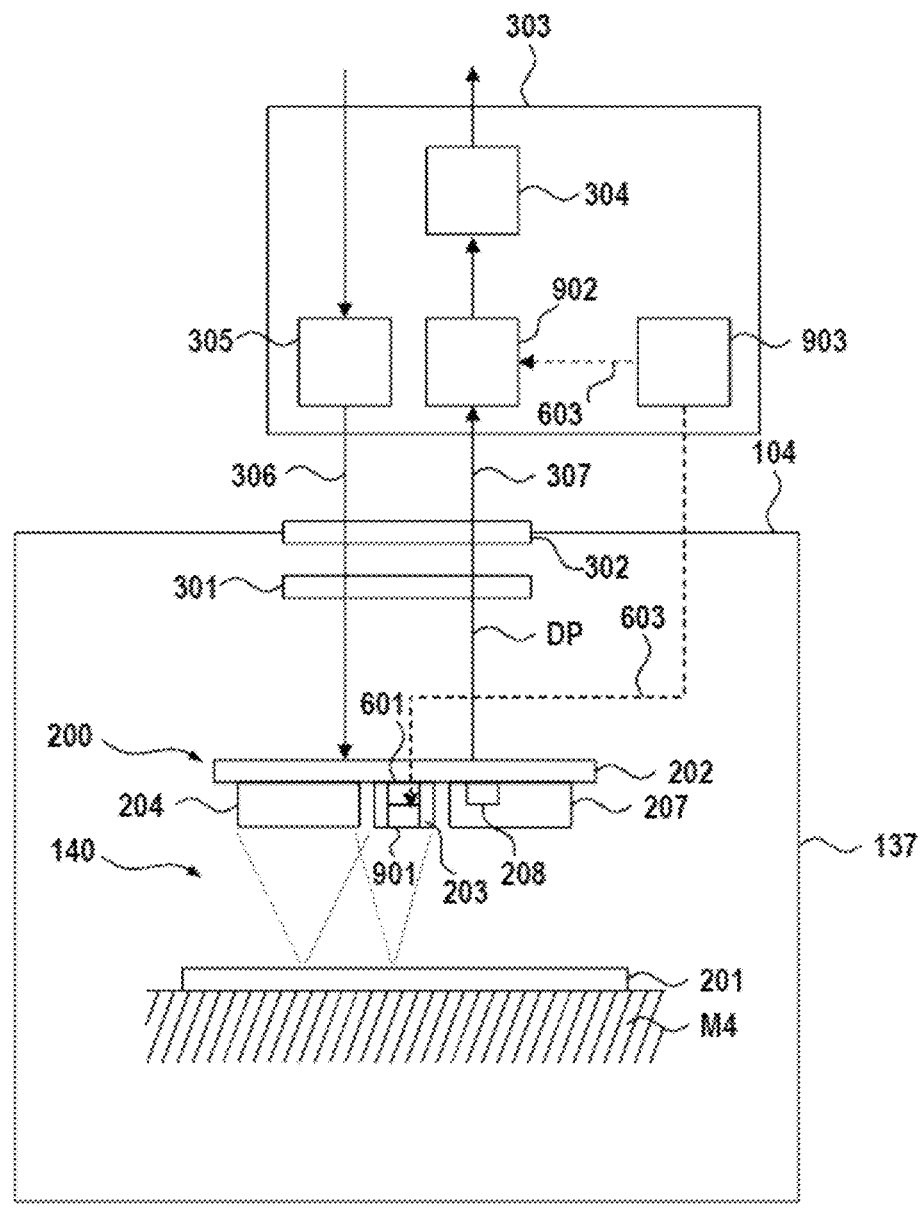
FIG. 15 shows a schematic view of a further embodiment of a projection system having an assigned control apparatus.

Examples of this are shown in FIGS. 12 and 15. The latter aforementioned advantage applies, in particular, to the arrangement of FIG. 15, in which the demodulation is carried out in the control apparatus 303 and therefore externally in the vacuum housing 137.

FIG. 12 shows a schematic view of a further embodiment of a projection system 104 having an assigned control apparatus 303. The embodiment of the sensor arrangement of FIG. 12 is based on the embodiment of FIG. 3. The light source 203 of FIG. 12 includes a light-producing unit 601 for producing a light beam and a modulator unit 901 for generating a modulated light beam from the light beam produced by the light-producing unit 601. Further, the signal-processing unit 207 of FIG. 12 includes the A/D converter 208 and a demodulator 902 disposed upstream of the A/D converter 208. Further, provision is made of a modulation source 903 which actuates the modulator unit 901 via a synchronization signal 603. Furthermore, the demodulation source 903 actuates the demodulation unit 902 with the same synchronization signal 603. Consequently, the modulator unit 901 and the demodulator 902 are synchronized to one another.

The demodulation can be undertaken in digital (see FIG. 12) or analog (see FIG. 5) fashion. The digital demodulation involves relatively fast A/D converters, for example with a sampling rate of 10 to 100 MHz.

Figure 13:
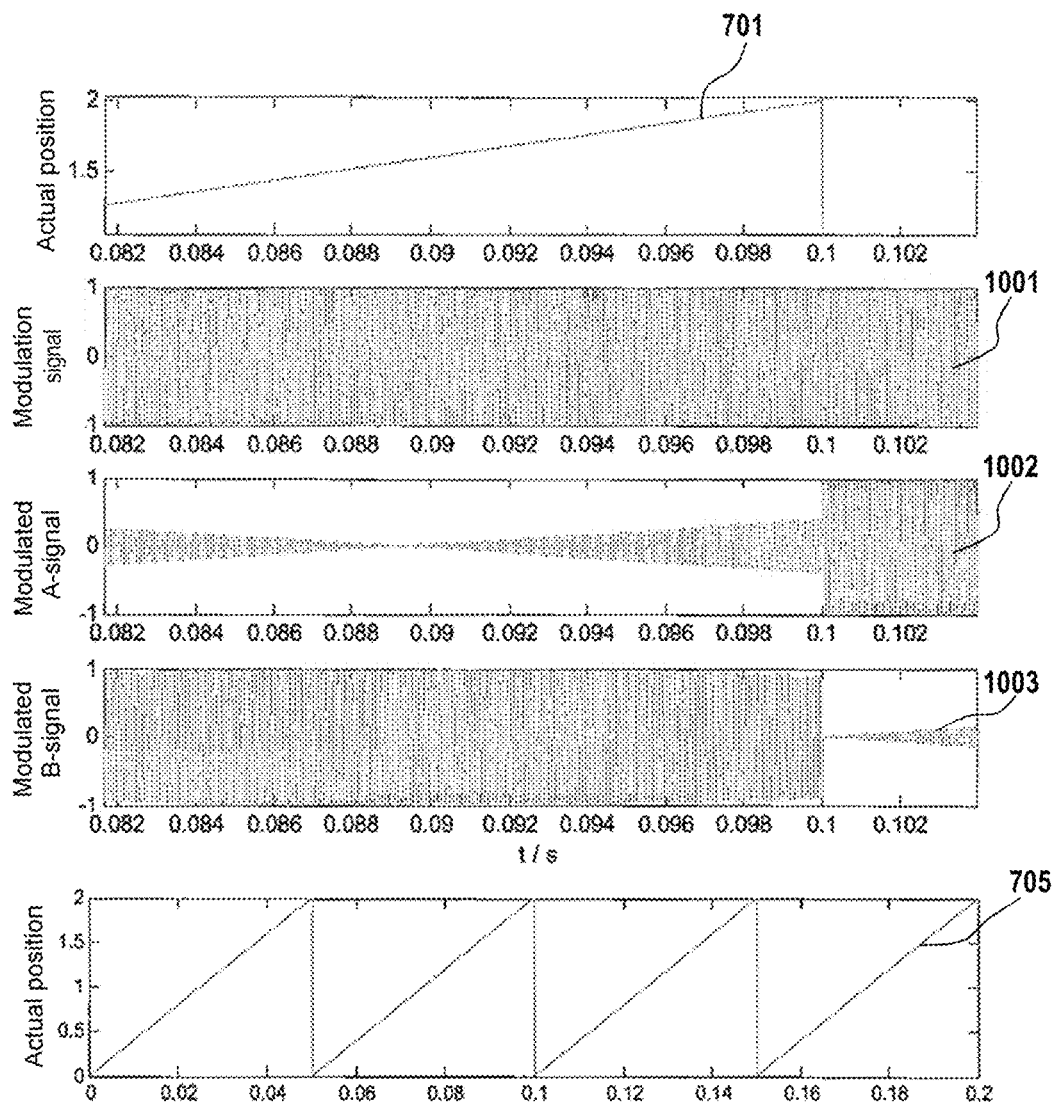
FIG. 13 shows simulation results for a modulated exposure with a sinusoidal form in the projection system of FIG. 12.

FIG. 13 shows simulation results for a modulated exposure with a sinusoidal form in the projection system 104 of FIG. 12. Here, the curve 701 shows the actual fine position of the mirror (in normalized form), the curve 1001 shows the modulation signal (modulated exposure), the curve 1002 shows the modulated A-signal, and the curve 1003 shows the modulated B-signal. The curve 705 once again shows the measured fine position of the mirror with a different scaling (in a normalized form).

Here, FIG. 13 illustrates that the modulated A- and B-signals of the curves 1002 and 1003 have the typical sinusoidal form or cosinusoidal form corresponding to the encoder position as approximate form (envelope). Additionally, the A- and B-signals are multiplied by the modulation signal 1001.

In the case of 1/f noise, the quality of the measured position signal can be improved by increasing the modulation frequency, for example from 200 kHz to 500 kHz.

Figure 14:
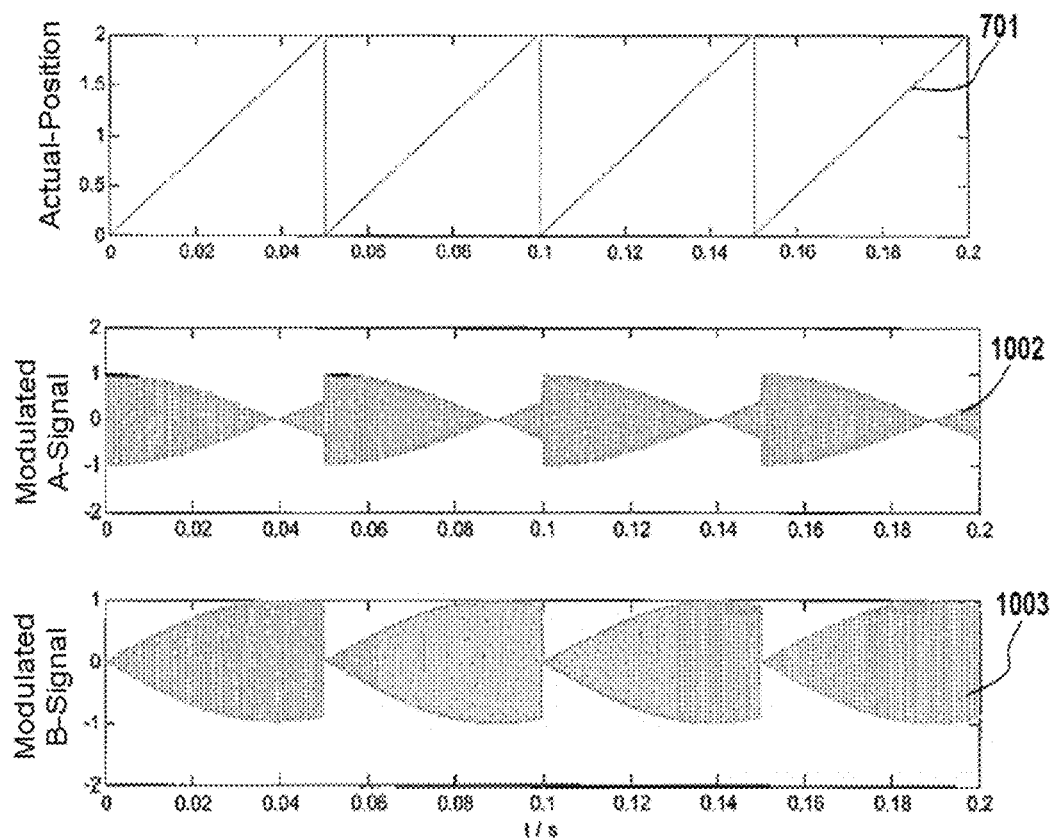
FIG. 14 shows simulation results for demodulation and position determination in the projection system of FIG. 12.

Further, FIG. 14 shows simulation results for the demodulation and determination of the position for the projection system 104 of FIG. 12. Here, the curve 701 of FIG. 14 shows the actual fine position of the mirror (in normalized form), the curve 1002 shows the modulated A-signal, and the curve 1003 shows the modulated B-signal.

FIG. 15 depicts a further embodiment of the sensor arrangement having position sensor apparatuses 140 and an evaluation apparatus 303. The embodiment of FIG. 15 differs from the embodiment of FIG. 12 in terms of the arrangement of the demodulator 902. In the embodiment of FIG. 15, the demodulator 902 is arranged in the control apparatus 303 and disposed immediately upstream of the evaluation apparatus 304.

Figure 16:
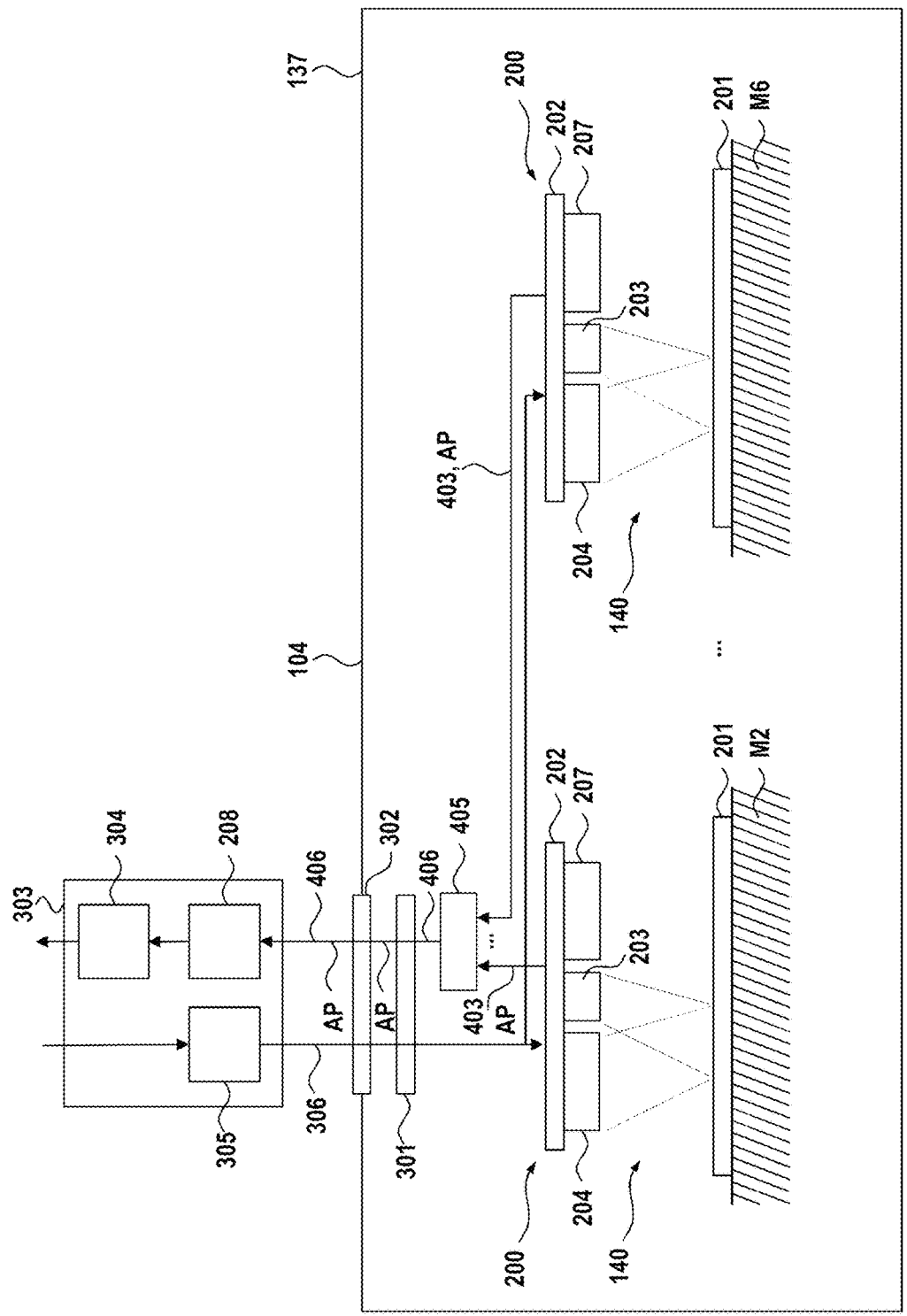
FIG. 16 shows a schematic view of a further embodiment of a projection system having an assigned control apparatus.

FIG. 16 shows a schematic view of a further embodiment of a projection system 104 having an assigned control apparatus 303. The sensor arrangement of FIG. 16 includes a multiplicity N3 of position sensor apparatuses 140 arranged in the vacuum housing 137, wherein a respective position sensor apparatus 140 is assigned to one of a plurality N2 of actuatable mirrors M2-M6 of the lithography apparatus 100 of the projection system 104. The respective position sensor apparatus 140 of FIG. 16 corresponds to that of FIG. 4. Five mirrors M2-M6 (N2=5) are actuatable in the example of FIG. 16. Further, six position sensor apparatuses 140 are assigned to each of the five actuatable mirrors M2-M5 according to the six degrees of freedom (N3=6·N2=30). For reasons of clarity, only one position sensor apparatus 140 assigned to an actuatable mirror M2-M6 is respectively imaged in FIG. 16. The evaluation apparatus 304 is integrated in the control apparatus 303 in the embodiment of FIG. 16.

Further, the sensor arrangement of FIG. 16 has an information collection apparatus 405 that is arranged in the vacuum housing 137. The information collection apparatus 405 is connected to the evaluation apparatus 304 arranged outside of the vacuum housing 137 via a cable 406. The information collection apparatus 405 is configured to transfer the N3 electrical position signals provided by the N3 position sensor apparatuses 140 via the cable 406 via time multiplexing or via frequency multiplexing in analog fashion.

For the example of a pulsed light beam, the position signals are transferred via time multiplexing or via frequency multiplexing in analog fashion. For the example of a sinusoidal light beam, the position signals are transferred via frequency multiplexing in analog fashion.

Figure 17:
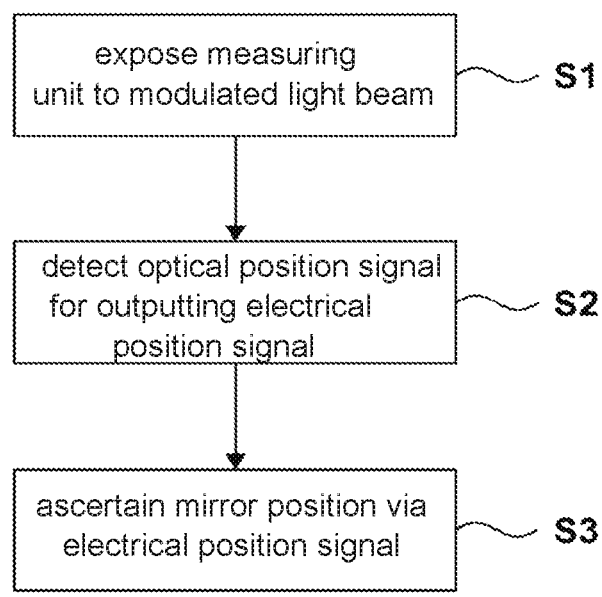
FIG. 17 shows an embodiment of a method for ascertaining a position of at least one mirror of the lithography apparatus.

FIG. 17 shows an embodiment of a method for ascertaining a respective position of a number of mirrors M1-M6 of a lithography apparatus 100.

The method of FIG. 17 includes the following steps S1 to S3:

In step S1, a measuring unit 201 is exposed with a modulated light beam by a light source 203. By way of example, the modulated light beam is pulsed or has a sinusoidal envelope.

In step S2, there is detection of an optical position signal 204, provided by the measuring unit 201 in the case of exposure of same via the modulated light beam, for outputting an electrical position signal by a detection unit. Here, an analog electrical position signal can be converted into a digital electrical position signal by an A/D converter 208.

In step S3, the position of the mirror M1-M6 is ascertained via the electrical position signal.

By way of example, steps S1 to S3 are carried out by an integrated component 200, which integrates the light source 203 and the detection unit 204, arranged in a vacuum housing 137.

Although the present invention has been described on the basis of exemplary embodiments, it is modifiable in diverse ways.

LIST OF REFERENCE SIGNS

100 Lithography apparatus
100A EUV lithography apparatus
102 Beam-shaping and illumination system
104 Projection system 106A EUV light source
108A EUV radiation
110 Mirror
112 Mirror
114 Mirror
116 Mirror
118 Mirror
120 Reticle
122 Wafer
124 Optical axis of the projection system
136 Mirror
M1-M6 Mirrors
137 Vacuum housing
140 Position sensor apparatus
200 Integrated component
201 Measuring unit
202 Carrier printed circuit board
203 Light source
204 Detection unit
205 Photodetector
206 Optical unit
207 Signal-processing unit
208 A/D converter
209 Sampling unit
210 Quantization unit
211 Optical unit
301 Connector bracket
302 Vacuum through-connection apparatus
303 Control apparatus
304 Evaluation apparatus
305 Power supply apparatus
306 Voltage supply line
307 Data line
308 Amplifier
309 Sensor electronics
310 Optical fiber
311 FPGA
312 Driver unit
401 First data line
402 Second data line
403 Line
404 Data collection apparatus
405 Information collection apparatus
406 Cable
501 Bus system
502 Bus line
601 Light-producing unit
602 Pulse generator
603 Synchronization signal
701 Actual fine position of the mirror, normalized
702 Pulse signal
703 A-signal of the detection unit, pulsed
704 B-signal of the detection unit, pulsed
705 Measured fine position of the mirror, normalized
801 Signal analysis unit
901 Modulator unit
902 Demodulation unit
903 Modulation source
1001 Modulation signal
1002 A-signal of the detection unit, modulated
1003 B-signal of the detection unit, modulated
AP Analog position signal
AS Sampled signal
DA Demodulated analog position signal
DP Digital position signal
S1-S3 Method steps
t Time
VP Amplified analog position signal

What is claimed is:

1. A sensor arrangement, comprising:
a number of position sensor apparatuses, each position sensor apparatus comprising:
 a measuring unit;
 a light source to expose the measuring unit to a modulated light beam so that the measuring unit provides an optical position signal of a position of a mirror of a lithography apparatus during exposure by the modulated light beam; and
 a detection unit comprising a plurality of photodetectors to output an electrical position signal by detection of the provided optical position signal; and
an evaluation apparatus configured to ascertain the position of the mirror via the electrical position signal,
wherein:
 the measuring unit comprises:
  a reference pattern to influence the light beam; and
  a mirror arrangement for reflecting the influenced light beam;
 the evaluation apparatus comprises a signal-processing unit comprising at least one A/D converter to convert an analog electrical position sensor output by the photodetector into a digital electrical position signal; and
 the light source and the signal-processing unit are disposed in an integrated component arranged in a vacuum housing.

2. The sensor arrangement of claim 1, wherein the light source is configured to generate a pulsed light beam for exposing the measuring unit.

3. The sensor arrangement of claim 2, further comprising:
a plurality N3 of position sensor apparatuses disposed in the vacuum housing, a respective position sensor apparatus being assigned to one of a plurality N2 of actuatable mirrors of the lithography apparatus;
an information collection device in the vacuum housing; and
a cable connecting the information collection device to the evaluation apparatus,
wherein:
 the evaluation apparatus is outside of the vacuum housing; and
 the evaluation apparatus is configured to transfer the N3 electrical position signals provided by the N3 position sensor apparatuses in analog fashion via the cable using multiplexing or using frequency multiplexing.

4. The sensor arrangement of claim 1, wherein the light source is configured to generate a sinusoidal light beam for exposing the measuring unit.

5. The sensor arrangement of claim 4, further comprising:
a plurality N3 of position sensor apparatuses in the vacuum housing, a respective position sensor apparatus being assigned to one of a plurality N2 of actuatable mirrors of the lithography apparatus;
an information collection device in the vacuum housing; and
a cable connecting the collection device and the evaluation apparatus,
wherein the evaluation apparatus is outside the vacuum housing, and the evaluation device is configured to transfer the N3 electrical position signals provided by the N3 position sensor apparatuses in analog fashion via the cable using frequency multiplexing.

6. The sensor arrangement of claim 1, wherein the light source comprises:
a light-producing unit to produce a light beam; and
a modulator unit to generate the modulated light beam from the light beam produced by the light-producing unit.

7. The sensor arrangement of claim 6, wherein the light-producing unit comprises a semiconductor laser.

8. The sensor arrangement of claim 6, further comprising a synchronization device configured to synchronize the signal-processing unit and the light source, wherein the pulse generator comprises the synchronization device, and the pulse generator is configured to synchronize the signal-processing unit and the light source via the sequence of pulses.

9. The sensor arrangement of claim 1, wherein the light source comprises:
a light-producing unit to produce light beam; and
a pulse generator to actuate the light-producing unit via a sequence of pulses so that the light-producing unit outputs the modulated light beam.

10. The sensor arrangement of claim 1, further comprising a synchronization device configured to synchronize the signal-processing unit and the light source.

11. The sensor arrangement of claim 10, wherein:
the A/D converter comprises a sampling unit and a quantization unit; and
the synchronization device is configured to synchronize the sampling unit and the light source to generate the modulated light beam.

12. The sensor arrangement of claim 10, wherein:
the signal-processing unit comprises the A/D converter and a signal analysis unit disposed downstream of the A/D converter; and
the synchronization device is configured to synchronize the signal analysis unit and the light source to generate the modulated light beam.

13. The sensor arrangement of claim 12, wherein the A/D converter is configured to multiply sample the electrical position signal.

14. The sensor arrangement of claim 10, wherein:
the signal-processing unit comprises the A/D converter and a demodulator disposed upstream of the A/D converter; and
the synchronization device is configured to synchronize the demodulator and the light source to generate a sinusoidal light beam.

15. The sensor arrangement of claim 1, wherein the light source, the signal-processing unit and the photodetectors of the detection unit are provided in the integrated component.

16. The sensor arrangement of claim 1, further comprising a control apparatus to control actuators which are configured to actuate actuatable mirrors of the lithography apparatus.

17. The sensor arrangement of claim 16, wherein the control apparatus comprises the evaluation apparatus.

18. The sensor arrangement of claim 1, wherein the detection unit further comprises an optical unit to image the optical position signal that is provided by the measuring unit onto the photodetectors.

19. The sensor arrangement of claim 1, further comprising:
a plurality N3 of position sensor apparatuses in the vacuum housing, a respective position sensor apparatus being to one of a plurality N2 of actuatable mirrors of the lithography apparatus; and
a data collection device in the vacuum housing,
wherein:
the data collection device and the evaluation apparatus are connected via a data link;
the evaluation apparatus is disposed outside of the vacuum housing;
the evaluation apparatus is configured to collect N3 electrical position signals provided by the N3 position sensor apparatuses to form a digital collective signal; and
the evaluation unit is configured to transfer the digital collective signal to the evaluation apparatus via the data link.

20. The sensor arrangement of claim 19, wherein the data collection device and the evaluation apparatus are connected via a single data link.

21. The sensor arrangement of claim 19, wherein the data link is a unidirectional data link.

22. The sensor arrangement of claim 19, wherein the data link comprises:
a vacuum through-connection apparatus for a vacuum-suitable through-connection through the vacuum housing;
a first data line coupled between the data collection apparatus and the vacuum through-connection apparatus; and
a second data line coupled between the vacuum through-connection apparatus and the evaluation apparatus.

23. The sensor arrangement of claim 1, further comprising:
a plurality N3 of position sensor apparatuses disposed in the vacuum housing, a respective position sensor apparatus being assigned to one of a plurality N2 of actuatable mirrors of the lithography apparatus; and
a bus system in the vacuum housing,
wherein:
the bus system is connected to the evaluation apparatus;
the evaluation apparatus is disposed outside the vacuum housing; and
the bus system is configured to transfer the N3 electrical position signals provided by the N3 position sensor apparatuses to the evaluation apparatus.

24. The sensor arrangement of claim 23, further comprising a vacuum through-connection apparatus for a vacuum-suitable through-connection of the bus system through the vacuum housing.

25. The sensor arrangement of claim 24, wherein the bus system comprises a plurality of bus lines coupling the position sensor apparatuses, and the lines are connected to a connector bracket.

26. The sensor arrangement of claim 25, wherein the data link comprises first and second data lines, wherein the first data line is coupled between the connector bracket and the vacuum through-connection apparatus, and the second data line is coupled between the vacuum through-connection apparatus and the evaluation apparatus.

27. A projection system of a lithography apparatus, comprising:
a plurality N1 of mirrors comprising N2 actuatable mirrors, where N2 being less than or equal to N1; and
a sensor arrangement according to claim 1,
wherein respectively a number N4 of the position sensor apparatuses are assigned to one of the N2 actuatable mirrors, and N3=N4·N2.

28. The projection system of claim 27, further comprising:
a plurality of actuators to actuate the actuatable mirrors; and
a control apparatus to control the actuators.

29. The projection system of claim 28, wherein the control apparatus comprises the evaluation apparatus.

30. The projection system of claim 28, wherein the evaluation apparatus is configured to determine a respective position for each of the N2 actuatable mirrors depending on the respective electrical position signal.

31. The projection system of 30, wherein the control apparatus is configured to actuate the actuators depending on the positions, deter-mined by the evaluation apparatus, of the actuatable mirrors.

32. The projection system of claim 27, further comprising a power supply apparatus to supply the sensor arrangement with electrical power.

33. A lithography apparatus, comprising:
   a projection system, comprising:
      a plurality N1 of mirrors comprising N2 actuatable mirrors, where N2 being less than or equal to N1; and
      a sensor arrangement according to claim 1,
   wherein respectively a number N4 of the position sensor apparatuses are assigned to one of the N2 actuatable mirrors , and N3=N4·N2.

34. A method, comprising:

exposing a measuring unit to a modulated light beam;

using a detection unit having a plurality of photodetectors to detect an optical position signal that is provided by the measuring unit when exposed to the modulated light beam, for the output of an electrical position signal, the measuring unit having a reference pattern to influence the light beam and a mirror arrangement to reflect the influenced light beam; and ascertaining the position of the mirror via the electrical position signal using an evaluation apparatus comprising a signal-processing unit comprising at least one A/D converter to convert an analog electrical position sensor output by the photodetector into a digital electrical position signal, wherein at least the light source and the signal-processing unit are disposed in an integrated component in a vacuum housing.

* * * * *

UNITED STATES PATENT AND TRADEMARK OFFICE
CERTIFICATE OF CORRECTION

| | | |
|---|---|---|
| PATENT NO. | : 10,437,155 B2 | Page 1 of 1 |
| APPLICATION NO. | : 15/807813 | |
| DATED | : October 8, 2019 | |
| INVENTOR(S) | : Jan Horn, Stefan Krone and Lars Berger | |

It is certified that error appears in the above-identified patent and that said Letters Patent is hereby corrected as shown below:

In the Claims

Column 20, Line 62, Claim 27, delete "mirrors ," and insert -- mirrors, --;

Column 21, Line 7, Claim 31, after "of" insert -- claim --;

Column 21, Line 21 (approx.), Claim 33, delete "mirrors ," and insert -- mirrors, --.

Signed and Sealed this
Twelfth Day of May, 2020

Andrei Iancu
*Director of the United States Patent and Trademark Office*